US012761824B2

(12) United States Patent
Kanno

(10) Patent No.: US 12,761,824 B2
(45) Date of Patent: Oct. 13, 2026

(54) MEMORY SYSTEM CHANGING WRITE SIZE AND WRITE MODE AND METHOD OF CONTROLLING NONVOLATILE MEMORY BY CHANGING WRITE SIZE AND WRITE MODE

(71) Applicant: KIOXIA CORPORATION, Tokyo (JP)

(72) Inventor: Shinichi Kanno, Ota (JP)

(73) Assignee: KIOXIA CORPORATION, Tokyo (JP)

( * ) Notice: Subject to any disclaimer, the term of this patent is extended or adjusted under 35 U.S.C. 154(b) by 10 days.

(21) Appl. No.: 18/938,394

(22) Filed: Nov. 6, 2024

(65) Prior Publication Data

US 2025/0060894 A1 Feb. 20, 2025

Related U.S. Application Data

(63) Continuation of application No. 18/357,231, filed on Jul. 24, 2023, now Pat. No. 12,175,109, which is a continuation of application No. 17/653,324, filed on Mar. 3, 2022, now Pat. No. 11,755,217.

(30) Foreign Application Priority Data

Jul. 14, 2021 (JP) ................................ 2021-116445

(51) Int. Cl.
*G06F 3/06* (2006.01)
*G11C 8/08* (2006.01)

(52) U.S. Cl.
CPC ............ *G06F 3/064* (2013.01); *G06F 3/0604* (2013.01); *G06F 3/0631* (2013.01); *G06F 3/0652* (2013.01); *G06F 3/0656* (2013.01); *G06F 3/0679* (2013.01); *G11C 8/08* (2013.01)

(58) Field of Classification Search
CPC ...... G06F 3/064; G06F 3/0604; G06F 3/0631; G06F 3/0652; G06F 3/0656
See application file for complete search history.

(56) References Cited

U.S. PATENT DOCUMENTS

| | | | | |
|---|---|---|---|---|
| 10,747,462 | B2 | 8/2020 | Shin | |
| 10,956,067 | B2 | 3/2021 | Shida | |
| 11,003,385 | B2 | 5/2021 | Kanno | |
| 11,755,217 | B2 | 9/2023 | Kanno | |
| 12,175,109 | B2 * | 12/2024 | Kanno | G06F 3/0688 |
| 2008/0301256 | A1 | 12/2008 | Mcwilliams | |
| 2013/0282955 | A1 | 10/2013 | Parker | |

(Continued)

*Primary Examiner* — Edward J Dudek, Jr.
(74) *Attorney, Agent, or Firm* — Oblon, McClelland, Maier & Neustadt, L.L.P.

(57) ABSTRACT

According to one embodiment, a controller manages a first set of blocks and a second set of blocks. The controller allocates a second block included in the second set of blocks to a first block included in the first set of blocks. In response to receiving one or more write command specifying the first block, the controller writes data associated with the one or more received write commands to the second block in units of a second minimum write size. When the first block is filled with data that has been written to the first block and unwritten region remains in the second block, the controller deallocates the second block from the first block, and allocates the deallocated second block to a write destination block other than the first block.

20 Claims, 25 Drawing Sheets

(56) References Cited

U.S. PATENT DOCUMENTS

| | | | | |
|---|---|---|---|---|
| 2019/0179698 | A1* | 6/2019 | Liu | G06F 3/0679 |
| 2019/0332316 | A1* | 10/2019 | Kanno | G06F 12/1009 |
| 2019/0361614 | A1* | 11/2019 | Natarajan | G06F 3/0679 |
| 2020/0194064 | A1* | 6/2020 | Barndt | G11C 16/08 |
| 2020/0387449 | A1* | 12/2020 | Simionescu | G06F 3/061 |
| 2021/0263674 | A1* | 8/2021 | Shin | G06F 3/061 |
| 2021/0365202 | A1* | 11/2021 | Shin | G06F 3/0679 |
| 2021/0409038 | A1* | 12/2021 | Benisty | H03M 13/1174 |
| 2022/0342585 | A1* | 10/2022 | Sharma | G06F 3/0679 |
| 2023/0147477 | A1* | 5/2023 | Kim | G06F 3/061<br>711/154 |

* cited by examiner

MEMORY SYSTEM CHANGING WRITE SIZE AND WRITE MODE AND METHOD OF CONTROLLING NONVOLATILE MEMORY BY CHANGING WRITE SIZE AND WRITE MODE

CROSS REFERENCE TO RELATED APPLICATIONS

This application is a continuation of and claims benefit under 35 U.S.C. § 120 to U.S. application Ser. No. 18/357,231, filed Jul. 24, 2023, which is a continuation of and claims benefit under 35 U.S.C. § 120 to U.S. application Ser. No. 17/653,324 (now U.S. Pat. No. 11,755,217), filed Mar. 3, 2022, and is based upon and claims the benefit of priority under 35 U.S.C. § 119 from Japanese Patent Application No. 2021-116445, filed Jul. 14, 2021, the entire contents of each of which are incorporated herein by reference.

FIELD

Embodiments described herein relate generally to a technique for controlling a nonvolatile memory.

BACKGROUND

In recent years, a memory system implemented with a nonvolatile memory has been widely used. As one of such memory systems, a solid state drive (SSD) implemented with a NAND flash memory has been known. The SSD is used as a storage device of a host computing system such as a server in a data center.

In a storage device used in a host computing system such as a server, it may be necessary to write different data to different write destination blocks of a nonvolatile memory. In order to cope with this, it is assumed to use each of some blocks among the blocks included in the nonvolatile memory as a shared write buffer shared by a plurality of write destination blocks.

In this case, data to be written to different write destination blocks are written in a mixed manner to each block used as the shared write buffer. In a case where it is necessary to execute a garbage collection operation on these blocks, an increase in write amplification of the nonvolatile memory is caused.

Therefore, there is a demand for realization of a new technology capable of efficiently writing data to a plurality of write destination blocks without causing an increase in write amplification.

DETAILED DESCRIPTION

Various embodiments will be described hereinafter with reference to the accompanying drawings.

In general, according to one embodiment, a memory system is connectable to a host. The memory system includes a nonvolatile memory and a controller. The nonvolatile memory includes a plurality of blocks. Each of the plurality of blocks is a unit for a data erase operation. The controller is electrically connected to the nonvolatile memory. The controller is configured to manage a first set of blocks and a second set of blocks among the plurality of blocks, write data to the block included in the first set of blocks in units of a first minimum write size and write data to the block included in the second set of blocks in units of a second minimum write size smaller than the first minimum write size. When a first block included in the first set of blocks is opened as a write destination block, the controller allocates a second block included in the second set of blocks to the first block. In response to receiving one or more write commands specifying the first block from the host, the controller writes first data associated with the one or more received write commands to the second block in units of the second minimum write size. In response to completion of writing the first data to the second block, the controller writes the first data to the first block in units of the first minimum write size. When the first block is filed with data that has been written to the first block and an unwritten region remains in the second block, the controller deallocates the second block from the first block, allocates the deallocated second block to a first write destination block other than the first block, and write only data to be written to the first write destination block to the unwritten region of the second block, wherein the first write destination block is among a plurality of write destination blocks allocated from the first set of blocks.

Figure 1:
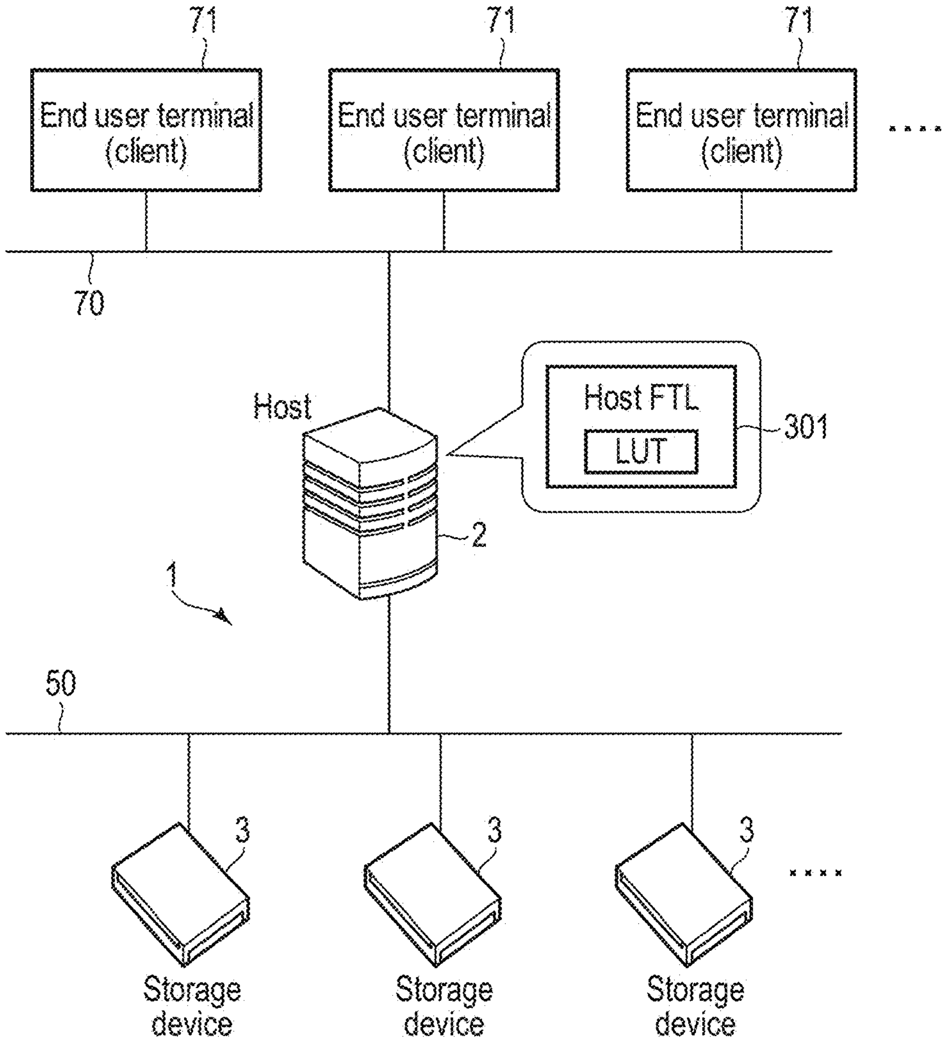
FIG. 1 is a block diagram illustrating an example of a configuration of an information processing system including a memory system according to the embodiment.

FIG. 1 is a block diagram illustrating an example of a configuration of an information processing system including a memory system according to the embodiment. An information processing system 1 includes a host (host device) 2 and a storage device 3. The host (host device) 2 is an information processing apparatus configured to access one or more storage devices 3. The information processing apparatus is, for example, a personal computer or a server computer.

Hereinafter, a case where an information processing apparatus such as a server computer is used as the host 2 will be mainly described.

A typical example of the server computer functioning as the host 2 is a server computer (hereinafter, referred to as a server) in a data center.

In a case where the host 2 is realized by a server in a data center, the host 2 may be connected to a plurality of storage devices 3. Furthermore, the host 2 may be connected to a plurality of end user terminals (clients) 71 via a network 70. The host 2 can provide various services to these end user terminals 71.

Examples of services that can be provided by the host 2 include (1) Platform as a Service (PaaS) that provides a system operation platform to each client (each end user terminal 71), and (2) Infrastructure as a Service (IaaS) that provides an infrastructure such as a virtual server to each client (each end user terminal 71).

A plurality of virtual machines may be executed on a physical server functioning as the host 2. Each of the virtual machines executed on the host 2 can function as a virtual server configured to provide various services to a client (end user terminal 71) corresponding to the virtual machine. In each virtual machine, an operating system and a user application used by the end user terminal 71 corresponding to the virtual machine are executed.

In the host (server) 2, a flash translation layer (host FTL) 301 is also executed. The host FTL 301 includes a look-up table (LUT). The LUT is an address translation table used to manage mapping between each data identifier and each physical address of the nonvolatile memory in the storage device 3. The host FTL 301 can know the data placement on the nonvolatile memory in the storage device 3 by using the LUT.

The storage device 3 is a semiconductor storage device. The storage device 3 writes data to the nonvolatile memory. Then, the storage device 3 reads data from the nonvolatile memory.

The storage device 3 can execute low-level abstraction. The low-level abstraction is a function for abstraction of a nonvolatile memory. The low-level abstraction includes a function of assisting the data placement and the like. The function of assisting the data placement includes, for example, a function of allocating a physical address indicating a physical storage location in the nonvolatile memory to which user data is to be written by a write command transmitted from the host 2, and a function of notifying the upper layer (host 2) of the allocated physical address.

The storage device 3 is connected to the host 2 through a cable or a network. Alternatively, the storage device 3 may be built in the host 2.

The storage device 3 executes communication with the host 2 in accordance with a certain logical interface standard. The logical interface standard is, for example, Serial Attached SCSI (SAS), Serial ATA (SATA), or NVM Express™ (NVMe™) standard. When the standard of NVMe is used as the logical interface standard, for example, PCI Express™ (PCIe™) or Ethernet™ is used as a physical interface 50 connecting the storage device 3 and the host 2.

Figure 2:
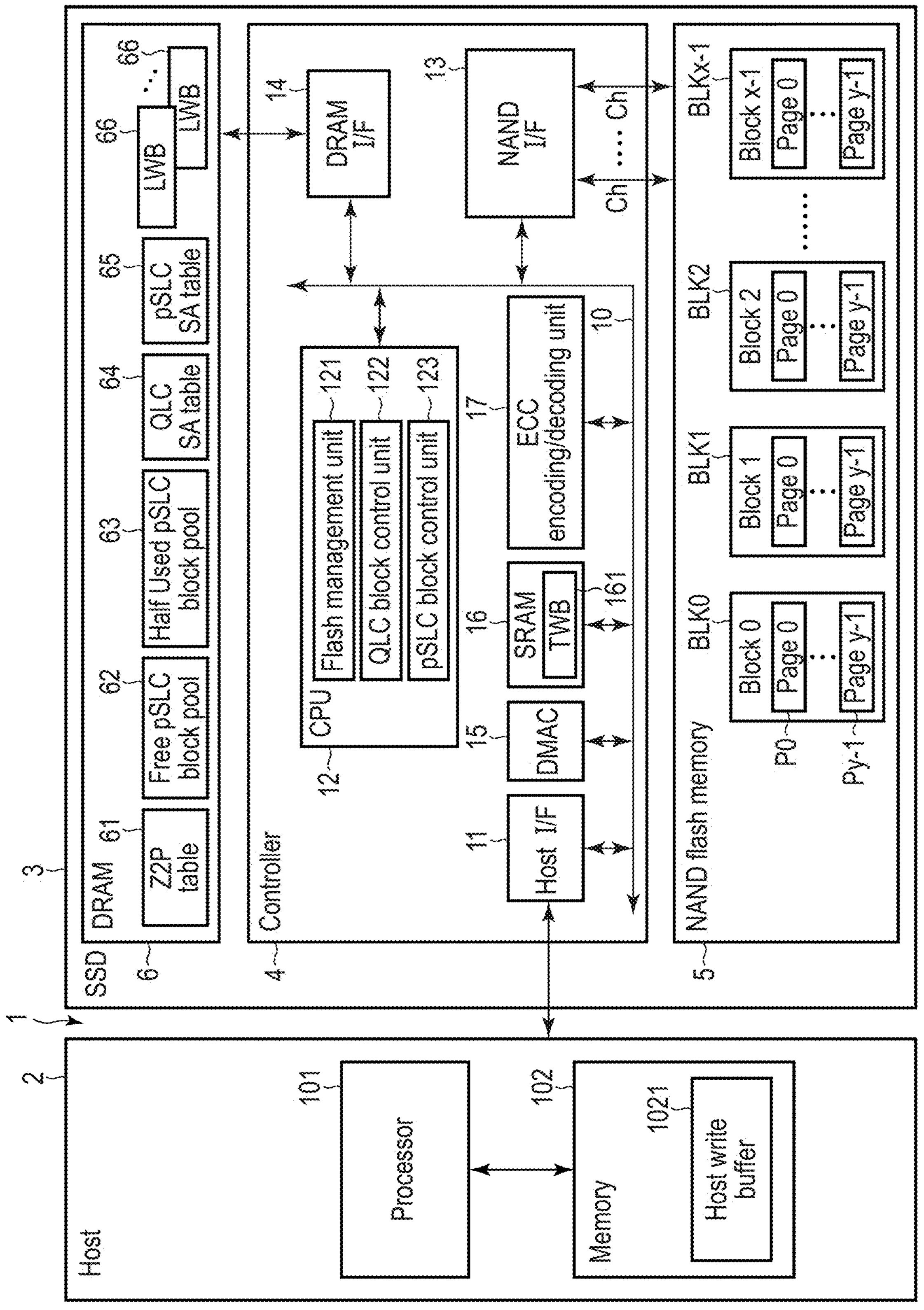
FIG. 2 is a block diagram illustrating an example of a configuration of a host and an example of a configuration of a memory system according to the embodiment.

Next, a configuration of an information processing system including the storage device according to the embodiment will be described. FIG. 2 is a block diagram illustrating an example of a configuration of a host and an example of a configuration of a storage device according to the embodiment. Hereinafter, it is assumed that the storage device according to the embodiment is realized as a solid state drive (SSD). Hereinafter, the storage device according to the embodiment will be described as an SSD 3. The information processing system 1 includes a host (host device) 2 and the SSD 3.

The host 2 is an information processing apparatus that accesses the SSD 3. The host 2 transmits a write request (write command), which is a request for writing data, to the SSD 3. In addition, the host 2 transmits a read request (read command), which is a request for reading data, to the SSD 3.

The host 2 includes a processor 101, the memory 102, and the like. The processor 101 is a central processing unit (CPU) configured to control an operation of each component in the host 2. The processor 101 executes software (host software) loaded from the SSD 3 into the memory 102. The host 2 may include another storage device other than the SSD 3. In this case, the host software may be loaded into the memory 102 from the other storage device. The host software includes an operating system, a file system, a device driver, an application program, and the like.

The memory 102 is a main memory provided in the host 2. The memory 102 is realized by, for example, a random access memory such as a dynamic random access memory (DRAM).

Part of the memory region of the memory 102 may be used as a host write buffer 1021. The host 2 temporarily stores data to be written to the SSD 3 in the host write buffer 1021. That is, the host write buffer 1021 holds data associated with a write command transmitted to the SSD 3.

Part of the memory region of the memory 102 may be used to store one or more submission queues/completion queue pairs (SQ/CQ pairs) (not illustrated). Each so/CQ pair includes one or more submission queues (SQ) and one completion queue (CQ) associated with the one or more submission queues (SQ). The submission queue (SQ) is a queue used to issue a request (command) to the SSD 3. The completion queue (CQ) is a queue used to receive a response indicating command completion from the SSD 3. The host 2 transmits various commands to the SSD 3 via one or more submission queues (SQ) included in each SQ/CQ pair.

The SSD 3 receives the write command and the read command transmitted from the host 2, and executes the data write operation and the data read operation for the nonvolatile memory based on the received write command and read command. As the nonvolatile memory, for example, a NAND flash memory is used.

The SSD 3 includes a controller 4 and a nonvolatile memory (for example, the NAND flash memory) 5. The SSD 3 may also include a random access memory, for example, a DRAM 6.

The controller 4 is a memory controller configured to control the NAND flash memory 5. The controller 4 may be realized by a circuit such as a system-on-a-chip (SoC). The controller 4 is electrically connected to the NAND flash memory 5 through a memory bus called a channel.

The NAND flash memory 5 is a nonvolatile semiconductor memory. The NAND flash memory 5 includes a memory cell array. The memory cell array includes a plurality of memory cells disposed in a matrix. The memory cell array in the NAND flash memory 5 includes a plurality of blocks BLK0 to BLKx−1. Each of the blocks BLK0 to BLKx−1 is a unit for a data erase operation for erasing data. The data erase operation is also simply referred to as an erase operation or erasing. Each of the blocks BLK0 to BLKx−1 is also referred to as a physical block, a flash block, or a memory block.

Each of the blocks BLK0 to BLKx−1 includes a plurality of pages (here, pages P0 to Py−1). Each page includes a plurality of memory cells connected to the same word line. Each of the pages P0 to Py−1 is a unit for a data write operation and a data read operation. Each of the blocks BLK0 to BLKx−1 is, for example, a quad-level cell block (QLC block). In the operation of writing data to each QLC block, by writing 4-bit data per memory cell, four pages of data is written to a plurality of memory cells connected to the same word line.

Also, some of the plurality of QLC blocks may be used as pseudo single-level cell blocks (pSLC). In the operation of writing data to each pSLC block, by writing one-bit data per memory cell, one page of data is written to a plurality of memory cells connected to the same word line.

The storage density per memory cell in the pSLC block is 1 bit (that is, one page per word line), and the storage density per memory cell in the QLC block is 4 bits (that is, 4 pages per word line). Therefore, the minimum write size of the QLC block is four times the minimum write size of the pSLC block.

A reading speed and a writing speed of data for the NAND flash memory 5 are lower as the storage density is higher, and are higher as the storage density is lower. Therefore, the time required for reading and writing data from and to the QLC block is longer than the time required for reading and writing data from and to the pSLC block.

The NAND flash memory 5 may include a plurality of NAND flash memory dies. Each NAND flash memory die may be a flash memory having a two-dimensional structure or a flash memory having a three-dimensional structure.

The DRAM 6 is a volatile semiconductor memory. The DRAM 6 is used, for example, to temporarily store data to be written to the NAND flash memory 5. The memory region of the DRAM 6 is used to store various management data used by the controller 4.

Next, a detailed configuration of the controller 4 will be described.

The controller 4 includes a host interface (I/F) 11, a CPU 12, a NAND interface (I/F) 13, a DRAM interface (I/F) 14, a direct memory access controller (DMAC) 15, a static RAM (SRAM) 16, and an error correction code (ECC) encoding/decoding unit 17.

The host interface 11, the CPU 12, the NAND interface 13, the DRAM interface 14, the DMAC 15, the SRAM 16, and the ECC encoding/decoding unit 17 are interconnected through a bus 10.

The host interface 11 is a host interface circuit that executes communication with the host 2. The host interface 11 is, for example, a PCIe controller. Alternatively, when the SSD 3 has a configuration incorporating a network interface controller, the host interface 11 may be realized as part of the network interface controller. The host interface 11 receives various commands from the host 2. The various commands are, for example, a write command and a read command.

The CPU 12 is a processor. The CPU 12 controls the host interface 11, the NAND interface 13, the DRAM interface 14, the DMAC 15, the SRAM 16, and the ECC encoding/decoding unit 17. The CPU 12 loads a control program (firmware) from the NAND flash memory 5 or a ROM (not illustrated) into the DRAM 6 in response to the supply of power to the SSD 3.

The CPU 12 manages blocks in the NAND flash memory 5. The management of the block in the NAND flash memory 5 is, for example, management of a defective block (bad block) included in the NAND flash memory 5 and wear leveling.

The NAND interface 13 is a memory interface circuit that controls a plurality of nonvolatile memory dies. The NAND interface 13 controls the NAND flash memory 5 under the control of the CPU 12. The NAND interface 13 is connected to a plurality of NAND flash memory dies through a plurality of channels (Ch), for example. The communication between the NAND interface 13 and the NAND flash memory 5 is executed in accordance with, for example, a Toggle NAND flash interface or an open NAND flash interface (ONFI).

The DRAM interface 14 is a DRAM interface circuit that controls the DRAM. The DRAM interface 14 controls the DRAM 6 under the control of the CPU 12. Part of the memory region of the DRAM 6 is used to store a Z2P table (zone-to-physical address translation table) 61, a free pSLC block pool 62, a Half Used pSLC block pool 63, a QLC SA table 64, a pSLC SA table 65, and a large write buffer (LWB) 66.

The DMAC 15 is a circuit that executes direct memory access (DMA). The DMAC 15 executes data transfer between the memory 102 of the host 2 and the DRAM 6 (or the SRAM 16) under the control of the CPU 12. For example, when write data is to be transferred from the host write buffer 1021 of the host 2 to a temporary write buffer (TWB) 161 of the SRAM 16, the CPU 12 specifies a transfer source address indicating a position in the host write buffer 1021, a size of the write data to be transferred, and a transfer destination address indicating a position in the TWB 161 to the DMAC 15. The TWB 161 is a memory region for temporarily storing write data associated with each write command received from the host 2. Here, it is assumed that part of the memory region of the SRAM 16 is used as the TWB 161, but part of the memory region of the DRAM 6 may be used as the TWB 161. In addition, the TWB 161 may have a memory region having a size equal to or larger than the minimum write size of the QLC block.

When data is to be written to the NAND flash memory 5, the ECC encoding/decoding unit 17 encodes the data to add an error correction code (ECC) as a redundant code to the data. When data is read from the NAND flash memory 5, the ECC encoding/decoding unit 17 executes error correction of the data using the ECC added to the read data.

Next, processing executed by the CPU 12 will be described. The CPU 12 can function as a flash management unit 121, a QLC block control unit 122, and a pSLC block control unit 123. Some or all of the flash management unit 121, the QLC block control unit 122, and the pSLC block control unit 123 may be realized by dedicated hardware in the controller 4.

The flash management unit 121 controls an operation of writing write data to the NAND flash memory 5 based on a write command received from the host 2. The write command is a command (write request) that writes data (write data) to be written to the NAND flash memory 5. As the write command received from the host 2, a write command used in a Zoned Namespace (ZNS) defined in the standard of NVMe can be used.

In a case where the controller 4 supports the ZNS, the flash management unit 121 can operate the SSD 3 as a zoned device. In the zoned device, a plurality of zones to which a plurality of respective logical address ranges obtained by dividing a logical address space for accessing the SSD 3 is allocated is used as logical storage regions. One of a plurality of physical storage regions in the NAND flash memory 5 is allocated to each of the plurality of zones. As a result, the flash management unit 121 can treat each physical storage region in the NAND flash memory 5 as a zone.

The logical address space for accessing the SSD 3 is a continuous logical address used by the host 2 to access the SSD 3. The logical address includes, for example, a logical block address (LBA).

Hereinafter, a case where the flash management unit 121 supports the ZNS and a write command used in ZNS defined by the NVMe standard, that is, a write command specifying a zone is used as a write command for writing data to any zone will be mainly described.

QLC block control unit 122 allocates the plurality of QLC blocks to the plurality of zones, respectively. Alternatively, the QLC block control unit 122 may allocate a plurality of block groups to a plurality of zones. Each of the plurality of block groups includes two or more blocks (physical blocks) among a plurality of blocks (physical blocks) included in the NAND flash memory 5. Each block group is also referred to as a super block (QLC super block). That is, the QLC block control unit 122 allocates one QLC block to each of the plurality of zones. The QLC block allocated to each of the plurality of zones may be one physical block (QLC physical block) or one super block (QLC super block). The flash management unit 121 starts an operation of writing data to the QLC block allocated to any zone based on a write command for writing data to the zone. As the operation of writing data to the QLC block, the flash management unit 121 executes, for example, a multi-step write operation. The multi-step write operation includes at least a first-step write operation and a second-step write operation. The multi-step write operation is, for example, a foggy-fine write operation.

The foggy-fine write operation is performed by multiple write operations (foggy write operation, fine write operation) for the memory cells connected to the same word line. The first write operation (foggy write operation) is a write operation for roughly setting the threshold voltage of each memory cell, and the second write operation (fine write operation) is a write operation for adjusting the threshold voltage of each memory cell. The foggy-fine write operation is a write mode capable of reducing the influence of program disturb.

In the first write operation (foggy write operation), first, four pages of data is transferred to the NAND flash memory 5 in units of page size by the first data transfer operation. That is, when the data size (page size) per page is 16 KB, 64 KB of data is transferred to the NAND flash memory 5 in units of page size. Then, the first write operation (foggy write operation) for programming four pages of data into the memory cell array in the NAND flash memory 5 is executed.

As in the foggy write operation, in the second program operation (fine write operation), four pages of data is transferred again to the NAND flash memory 5 in units of page size in the second data transfer operation. The data transferred to the NAND flash memory 5 in the second data transfer operation is the same as the data transferred in the first data transfer operation. Then, the second write operation (fine write operation) for programming the transferred four pages of data to the memory cell array in the NAND flash memory 5 is executed.

Even when the foggy write operation for a plurality of memory cells connected to a certain word line is finished, the fine write operation for the plurality of memory cells connected to this word line cannot be immediately executed. The fine write operation for the plurality of memory cells connected to the word line can be executed after the foggy write operation for the memory cells connected to one or more subsequent word lines is finished. Therefore, the time required to write data in the QLC block is long. In addition, data written by the foggy write operation to a plurality of memory cells connected to a certain word line of the QLC block cannot be read until the foggy write operation for a memory cells connected to one or more subsequent word lines is finished and the fine write operation for a plurality of memory cells connected to this word line is finished.

Therefore, the data to be written to the QLC block is required to be held in any storage region until the fine write operation of this data is completed.

As described above, the flash management unit 121 writes data having the minimum write size of the QLC block (64 KB which is four times the page size) to a plurality of memory cells connected to each word line of the QLC block using a write mode (multi-step write operation such as the foggy-fine write operation) in which reading of data written to one word line of the plurality of word lines included in the QLC block is enabled after writing of data to one or more word lines subsequent to the one word line.

Note that, in a case where the NAND flash memory 5 has a multi-plane configuration including two planes, write operations for two QLC physical blocks selected from the two planes are simultaneously executed. These two QLC physical blocks are treated as one QLC block (QLC super block) including the two QLC physical blocks. Therefore, the minimum write size of the QLC block is 128 KB.

On the other hand, in the write operation on the pSLC block, the flash management unit 121 writes data having the minimum write size (page size) of the pSLC block to a plurality of memory cells connected to each word line of the pSLC block using a write mode (SLC mode) in which reading of data written to one word line of a plurality of word lines included in the pSLC block is enabled only by writing of data to this one word line. In the SLC mode, one page of data is transferred to the NAND flash memory 5 only once. Then, one page of data is written to a plurality of memory cells connected to one word line so that one bit is written per memory cell.

Hereinafter, the minimum write size of the QLC block is also referred to as a first minimum write size, and the minimum write size of the pSLC block is also referred to as a second minimum write size.

The pSLC block control unit 123 allocates a pSLC block to each of the QLC blocks opened as the write destination block in order to prevent data to be written to different QLC blocks from being mixed in one pSLC block. The pSLC block allocated to a certain QLC block is used as a nonvolatile storage region that temporarily holds only data to be written to the QLC block. That is, only data to be written to the certain QLC block is written to the pSLC block allocated to this QLC block. Data to be written to another QLC block is written to a pSLC block allocated to this another QLC block.

Therefore, one pSLC block is used to hold only the writing incomplete data of one QLC block, and does not hold the writing incomplete data of a plurality of QLC blocks at the same time. That is, it is possible to prevent a plurality of types of data to be written to different QLC blocks from being mixed in one pSLC block. Therefore, execution of the garbage collection operation on the pSLC block is unnecessary.

In addition, when a certain QLC block is filled with the readable data, in a state where an unwritten region remains in the pSLC block allocated to the QLC block, the pSLC block control unit 123 deallocates the pSLC block from the QLC block. Here, the readable data is data that has been written to the QLC block. Specifically, when writing to the QLC block is executed using the multi-step write operation, the readable data is data in which the multi-step write operation is completed. For example, when the fine write operation for certain data is completed, this data is readable data. When the QLC block is filled with the readable data, all the data already written to the pSLC block is the writing completion data in which the writing to the QLC block is completed. The writing completion data stored in the pSLC block can be read from the QLC block. Therefore, the writing completion data that has been written to the QLC block is no longer required to be held in the pSLC block.

In this case, the pSLC block control unit 123 allocates the deallocated pSLC block to another QLC block opened as the write destination block. Then, only data to be written to another QLC block is written to the unwritten region of the pSLC block. As described above, the pSLC block control unit 123 reuses the deallocated pSLC block as a nonvolatile storage region that temporarily holds only data to be written to another QLC block, and effectively uses the unwritten region of the pSLC block.

Data to be subjected to the garbage collection operation is only writing incomplete data in which writing to the QLC block is not completed. Therefore, even when data to be written to another QLC block is written to the remaining storage region of the pSLC block allocated to a certain QLC block, the writing incomplete data existing in this pSLC block is only the writing incomplete data to another QLC block. That is, the writing incomplete data corresponding to the different QLC blocks is not mixed in the pSLC block. Therefore, the garbage collection operation on the reused pSLC block is also unnecessary.

Next, a write control process executed by the flash management unit 121 will be described.

When receiving one or more write commands that writes data to a QLC block allocated to a certain zone, the flash management unit 121 first writes only data (first data) associated with the one or more received write commands to the pSLC block allocated to the QLC block in units of the second minimum write size. In response to completion of the writing of the first data to the pSLC block, the flash management unit 121 writes the first data to the QLC block in units of the first minimum write size.

Next, an example of a process of writing data to the pSLC block in units of the second minimum write size and an example of a process of writing data to the QLC block in units of the first minimum write size will be described.

First, a case where the TWB 161 is not used will be described. Hereinafter, it is assumed that data is written to the QLC block #1. For example, when a write command is received from the host 2, the flash management unit 121 classifies the received write command into a plurality of groups corresponding to a plurality of write destination QLC blocks (a plurality of zones). Among the received write commands, each write command specifying the QLC block #1 is classified into a group corresponding to the QLC block #1. Among the received write commands, each write command specifying the QLC block #2 is classified into another group corresponding to the QLC block #2. The flash management unit 121 calculates a total size of write data associated with one or more received write commands specifying the QLC block #1. Each write command includes a parameter indicating a size of corresponding write data, that is, a data length. Therefore, the flash management unit 121 can calculate the total size of the write data associated with the one or more received write commands specifying the QLC block #1 based on the data length included in each of the one or more received write commands specifying the QLC block #1.

The flash management unit 121 waits until the total size of the write data associated with one or more received write commands that specify the QLC block #1 reaches the second minimum write size. When the second minimum write size is 16 KB, the flash management unit 121 waits, for example, until one write command specifying the QLC block #1 as a write destination block and specifying a data length of 16 KB is received, or until four write commands specifying the QLC block #1 as a write destination block and specifying a data length of 4 KB are received, or until two write commands specifying the QLC block #1 as a write destination block and specifying a data length of 16 KB are received. When the total size of the write data associated with one or more received write commands specifying the QLC block #1 reaches the second minimum write size, the flash management unit 121 acquires the write data having the second minimum write size and associated with the one or more write commands from the host write buffer 1021. Then, the flash management unit 121 writes the acquired write data having the second minimum write size to the pSLC block allocated to the QLC block #1.

When the writing of the write data having the second minimum write size to the pSLC block is completed, the flash management unit 121 transmits one or more completion responses indicating completion of one or more received write commands to the host 2.

When receiving one or more subsequent write commands specifying the QLC block #1, the flash management unit 121 calculates the total size of the write data associated with the one or more subsequent write commands again. The flash management unit 121 waits until the total size of the write data associated with the one or more received subsequent write commands specifying the QLC block #1 reaches the second minimum write size. When the total size of the write data associated with the one or more received subsequent write commands specifying the QLC block #1 reaches the second minimum write size, the flash management unit 121 acquires the write data having the second minimum write size and associated with the one or more subsequent write commands from the host write buffer 1021. Then, the flash management unit 121 writes the acquired write data having the second minimum write size to the pSLC block allocated to the QLC block #1. When the writing of the write data having the second minimum write size to the pSLC block is completed, the flash management unit 121 transmits one or more completion responses indicating completion of the one or more received subsequent write commands to the host 2.

In this way, the flash management unit 121 writes data to the pSLC block in units of the second minimum write size.

The flash management unit 121 determines whether the total size of the data written to the pSLC block has reached the first minimum write size. The flash management unit 121 waits until the total size of the data written to the pSLC block reaches the first minimum write size. When the total size of the data written to the pSLC block reaches the first minimum write size, the flash management unit 121 reads data having the first minimum write size from the pSLC block. Then, the flash management unit 121 writes the read data having the first minimum write size to the QLC block #1.

In this case, for example, the flash management unit 121 transfers the read data having the first minimum write size to the NAND flash memory 5, and writes the transferred data to a plurality of memory cells connected to the first one word line in the QLC block #1 by the foggy write operation.

The flash management unit 121 again determines whether the total size of new data written to the pSLC block has reached the first minimum write size. The flash management unit 121 waits until the total size of new data newly written to the pSLC block reaches the first minimum write size. When the total size of new data written to the pSLC block reaches the first minimum write size, the flash management unit 121 reads the new data having the first minimum write size from the pSLC block. Then, the flash management unit 121 writes the read data having the first minimum write size to the QLC block #1.

In this case, for example, the flash management unit 121 transfers the read data having the first minimum write size to the NAND flash memory 5, and writes the transferred data to a plurality of memory cells connected to the next word line in the QLC block #1 by the foggy write operation.

In this way, the flash management unit 121 writes data to the QLC block #1 in units of the first minimum write size.

When the fine write operation on one or more word lines subsequent to the first one word line in the QLC block #1 is ended, the fine write operation on the first one word line is executable. In this case, the flash management unit 121 reads again the data having the first minimum write size written to the first one word line from the pSLC block. Then, the flash management unit 121 transfers the read data having the first minimum write size to the NAND flash memory 5 again, and writes the transferred data to a plurality of memory cells connected to the first word line in the QLC block #1 by the fine write operation.

As a result, the write operation of data for the plurality of memory cells connected to the first word line in the QLC block #1 is completed, and this data is readable from the QLC block #1.

Next, a case of using the TWB 161 will be described. The flash management unit 121 calculates a total size of write data associated with one or more received write commands specifying the QLC block #1. The flash management unit 121 waits until the total size of the write data associated with one or more received write commands specifying the QLC block #1 reaches the first minimum write size. When the first minimum write size is 128 KB, the flash management unit 121 waits, for example, until one write command specifying the QLC block #1 as a write destination block and specifying a data length of 128 KB is received, or until four write commands specifying the QLC block #1 as a write destination block and specifying a data length of 32 KB are received, or until 32 write commands specifying the QLC block #1 as a write destination block and specifying a data length of 4 KB are received.

When the total size of the write data associated with one or more received write commands specifying the QLC block #1 reaches the first minimum write size, the flash management unit 121 transfers the write data having the first minimum write size and associated with the one or more write commands from the host write buffer 1021 to the TWB 161. Then, the flash management unit 121 writes the write data having the first minimum write size transferred to the TWB 161 to the pSLC block allocated to the QLC block #1.

Further, the flash management unit 121 writes the write data having the first minimum write size transferred to the TWB 161 to the plurality of memory cells connected to the first word line of the QLC block #1 by the foggy write operation without reading the write data having the first minimum write size from the pSLC block.

When the writing of the write data having the first minimum write size to the pSLC block is completed, the flash management unit 121 transmits one or more completion responses indicating completion of one or more received write commands to the host 2.

As described above, by transferring the write data having the first minimum write size that is the minimum write size of the QLC block from the host write buffer 1021 to the TWB 161, it is possible write the write data having the first minimum write size transferred to the TWB 161 to the QLC block #1 without reading the write data having the first minimum write size from the pSLC block. Therefore, the number of times of data transfer required to be executed between the controller 4 and the NAND flash memory 5 can be reduced as compared with a case where the TWB 161 is not used.

When receiving one or more subsequent write commands specifying the QLC block #1, the flash management unit 121 calculates the total size of the write data associated with the one or more subsequent write commands again. The flash management unit 121 waits until the total size of the write data associated with the one or more received subsequent write commands specifying the QLC block #1 reaches the first minimum write size. When the total size of the write data associated with the one or more received subsequent write commands specifying the QLC block #1 reaches the first minimum write size, the flash management unit 121 transfers the write data having the first minimum write size and associated with the one or more subsequent write commands from the host write buffer 1021 to the TWB 161. Then, the flash management unit 121 writes the write data having the first minimum write size transferred to the TWB 161 to the pSLC block allocated to the QLC block #1. Then, the flash management unit 121 writes the write data having the first minimum write size transferred to the TWB 161 to the plurality of memory cells connected to the next word line of the QLC block #1 by the foggy write operation without reading the write data having the first minimum write size from the pSLC block.

When the writing of the write data having the first minimum write size to the pSLC block is completed, the flash management unit 121 transmits one or more completion responses indicating completion of one or more received subsequent write commands to the host 2.

In this way, the flash management unit 121 writes data to the QLC block #1 in units of the first minimum write size.

When the fine write operation on one or more word lines subsequent to the first one word line in the QLC block #1 is ended, the fine write operation on the first one word line is executable. In this case, the flash management unit 121 reads data having the first minimum write size written to the first one word line from the pSLC block. Then, the flash management unit 121 transfers the read data having the first minimum write size to the NAND flash memory 5 again, and writes the transferred data to a plurality of memory cells connected to the first word line in the QLC block #1 by the fine write operation.

As a result, the write operation of data for the plurality of memory cells connected to the first word line in the QLC block #1 is completed, and this data is readable from the QLC block #1.

Figure 3:
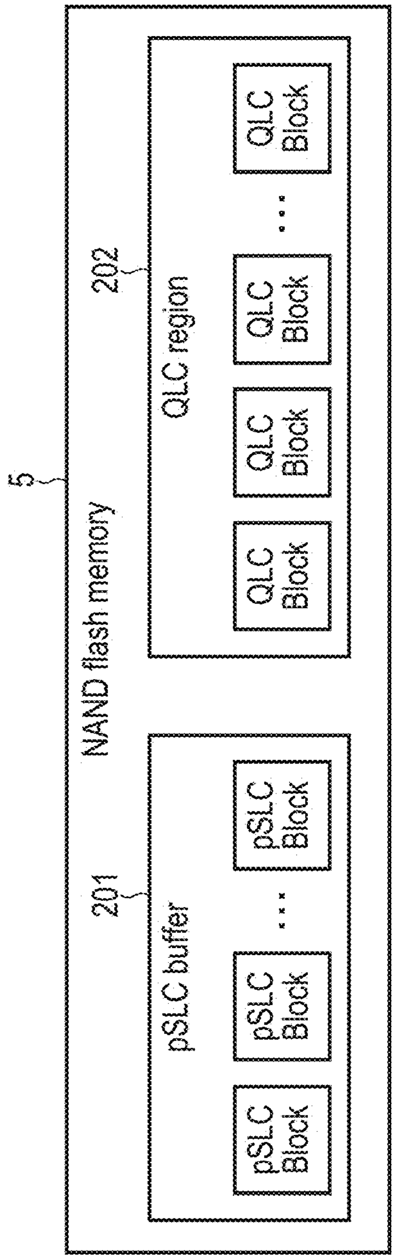
FIG. 3 is a block diagram illustrating a plurality of quad-level cell blocks (QLC blocks) used as storage regions for user data and a plurality of pseudo single-level cell blocks (pSLC blocks) used as pseudo single-level cell buffers (pSLC buffers).

Next, a storage region in the NAND flash memory 5 will be described. As illustrated in FIG. 3, the storage region in the NAND flash memory 5 is roughly divided into a pSLC buffer 201 and a QLC region 202.

QLC region 202 includes a plurality of QLC blocks. The pSLC buffer 201 includes a plurality of pSLC blocks. In other words, the plurality of blocks included in the NAND flash memory 5 can include a QLC block group and a pSLC block group. The QLC block control unit 122 may use each of the plurality of QLC blocks included in the QLC region 202 only as a QLC block, and the pSLC block control unit 123 may use each of the plurality of pSLC blocks included in the pSLC buffer 201 only as a pSLC block.

Figure 4:
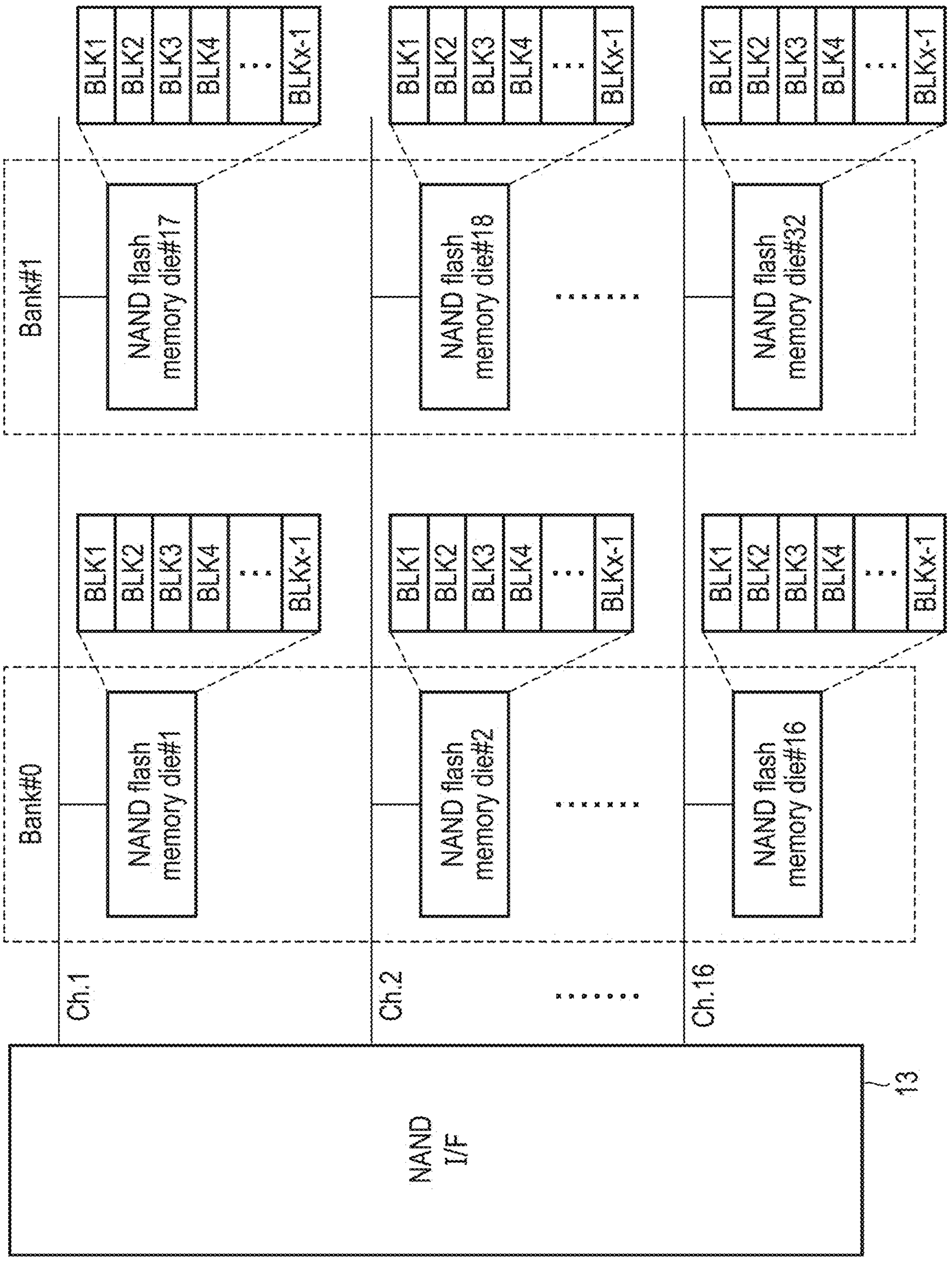
FIG. 4 is a block diagram illustrating a relationship between a plurality of channels and a plurality of NAND flash memory dies used in the memory system according to the embodiment.

Next, a relationship between a plurality of channels and a plurality of NAND flash memory dies will be described. FIG. 4 is a block diagram illustrating an example of a relationship between a plurality of channels and a plurality of NAND flash memory dies used in the memory system according to the embodiment.

The NAND flash memory 5 includes a plurality of NAND flash memory dies (or also referred to as NAND flash memory chips). Each NAND flash memory die is independently operable. Therefore, the NAND flash memory die is treated as a unit that can operate in parallel.

FIG. 4 illustrates a case where 16 channels Ch. 1 to Ch. 16 are connected to the NAND interface 13, and two NAND flash memory dies are connected to each of 16 channels Ch. 1 to Ch. 16. In this case, the 16 NAND flash memory dies #1 to #16 connected to the channels Ch. 1 to Ch. 16 may be configured as the bank #0, and the remaining 16 NAND flash memory dies #17 to #32 connected to the channels Ch. 1 to Ch. 16 may be configured as the bank #1. The bank is a unit for operating a plurality of memory modules in parallel by bank interleaving. In the configuration example of FIG. 4, up to 32 NAND flash memory dies can be operated in parallel by 16 channels and 2 bank interleaving.

The erase operation may be performed in units of one block (physical block) or in units of a block group (super block) including a set of a plurality of physical blocks that can operate in parallel.

Figure 5:
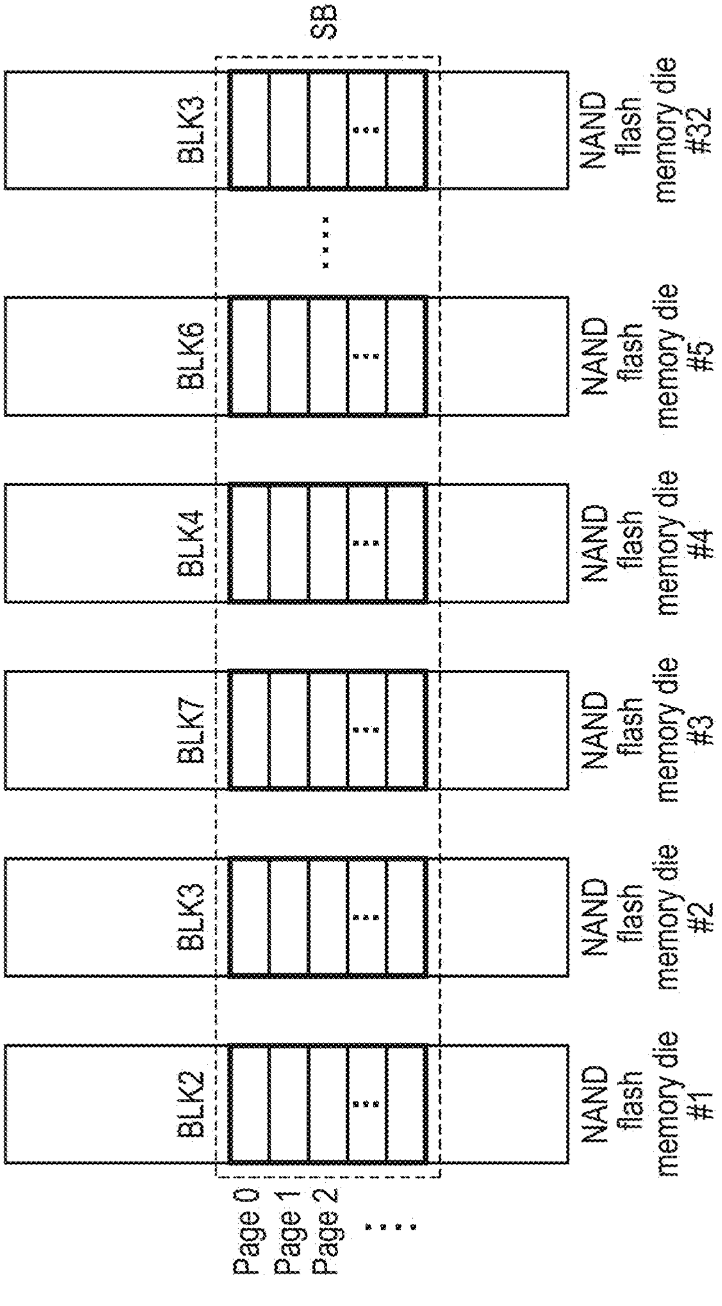
FIG. 5 is a diagram illustrating an example of a configuration of a block group (super block) used in the memory system according to the embodiment.

Next, an example of a configuration of the super block will be described. FIG. 5 is a diagram illustrating an example of a configuration of a certain block group (super block) used in the memory system according to the embodiment.

One block group, that is, one super block including a set of a plurality of physical blocks is not limited thereto, but may include a total of 32 physical blocks selected one by one from the NAND flash memory dies #1 to #32. Note that each of the NAND flash memory dies #1 to #32 may have a multi-plane configuration. For example, when each of the NAND flash memory dies #1 to #32 has a multi-plane configuration including two planes, one super block may include a total of 64 physical blocks selected one by one from 64 planes corresponding to the NAND flash memory dies #1 to #32.

FIG. 5 illustrates one super block (SB) including 32 physical blocks (here, the physical block BLK2 in the NAND flash memory die #1, the physical block BLK3 in the NAND flash memory die #2, the physical block BLK7 in the NAND flash memory die #3, the physical block BLK4 in the NAND flash memory die #4, the physical block BLK6 in the NAND flash memory die #5, . . . , and the physical block BLK3 in the NAND flash memory die #32).

Each QLC block in the QLC region 202 described with reference to FIG. 3 may be constructed with one super block (QLC super block) or one physical block (QLC physical block). Note that a configuration in which one super block includes only one physical block may be used, and in this case, one super block is equivalent to one physical block.

Each pSLC block included in the pSLC buffer 201 may also be configured by one physical block or may be configured by a super block including a set of a plurality of physical blocks.

Figure 6:
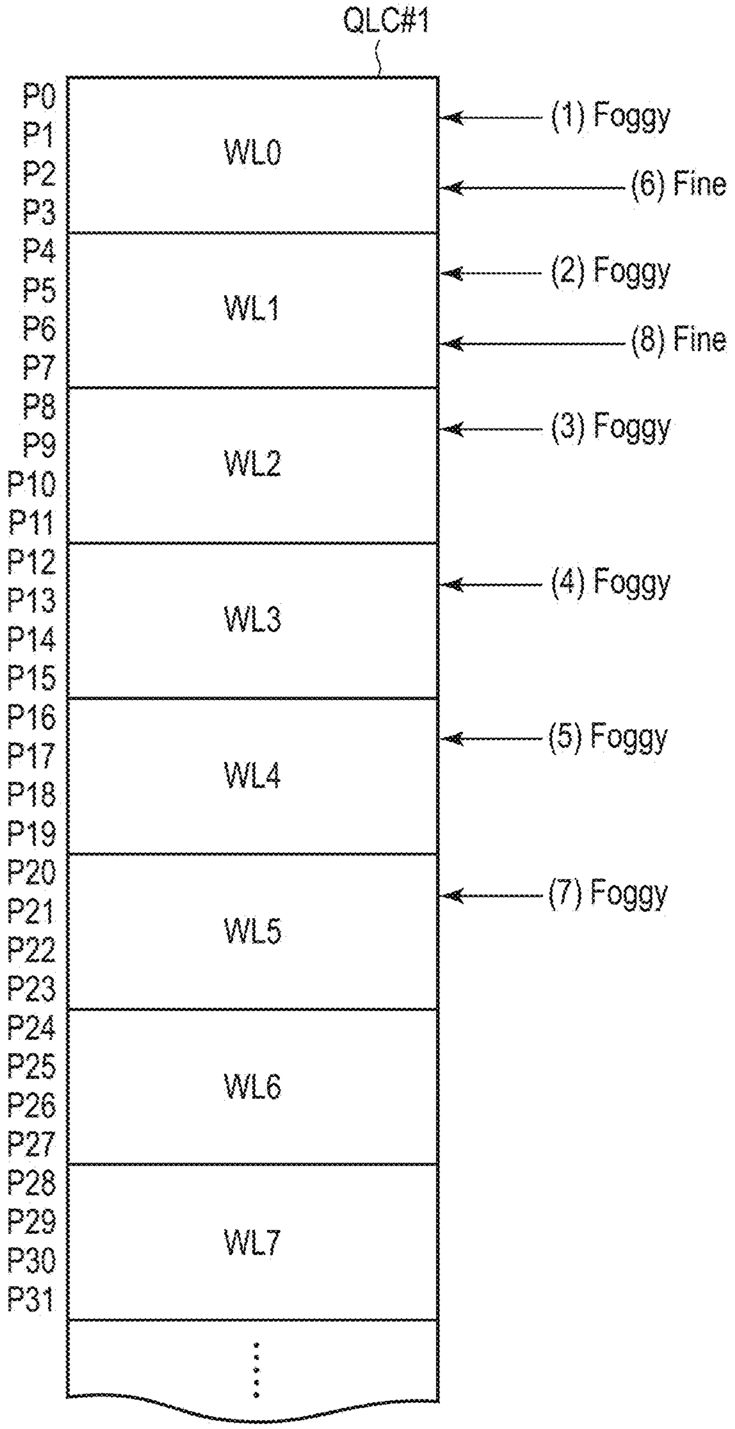
FIG. 6 is a diagram for explaining a multi-step write operation applied to the QLC block.

Next, the foggy-fine write operation on the QLC block executed by the flash management unit 121 will be described. FIG. 6 is a diagram for describing an operation of writing data in a mode of writing four bits per memory cell in a QLC block.

Here, a foggy-fine write operation in the case of reciprocating between five word lines will be exemplified. The foggy-fine write operation on the QLC block (QLC #1) is executed as follows.

(1) First, four pages (P0 to P3) of write data is transferred to the NAND flash memory 5 page by page, and a foggy write operation for writing the four pages (P0 to P3) of write data to a plurality of memory cells connected to the word line WL0 in QLC #1 is executed.

(2) Next, next four pages (P4 to P7) of write data is transferred to the NAND flash memory 5 page by page, and a foggy write operation for writing the four pages (P4 to P7) of write data to a plurality of memory cells connected to the word line WL1 in QLC #1 is executed.

(3) Next, next four pages (P8 to P11) of write data is transferred to the NAND flash memory 5 page by page, and a foggy write operation for writing the four pages (P8 to P11) of write data to a plurality of memory cells connected to the word line WL2 in QLC #1 is executed.

(4) Next, next four pages (P12 to P15) of write data is transferred to the NAND flash memory 5 page by page, and a foggy write operation for writing the four pages (P12 to P15) of write data to a plurality of memory cells connected to the word line WL3 in QLC #1 is executed.

(5) Next, next four pages (P16 to P19) of write data is transferred to the NAND flash memory 5 page by page, and a foggy write operation for writing the four pages (P16 to P19) of write data to a plurality of memory cells connected to the word line WL4 in QLC #1 is executed.

(6) When the foggy write operation for the plurality of memory cells connected to the word line WL4 is ended, the word line to be written returns to the word line WL0, and the fine write operation for the plurality of memory cells connected to the word line WL0 can be executed. Then, the four pages (P0 to P3) of write data, which is the same as the four pages (P0 to P3) of write data used in the foggy write operation on the word line WL0, is transferred again to the NAND flash memory 5 page by page, and the fine write operation for writing the four pages (P0 to P3) of write data to a plurality of memory cells connected to the word line WL0 in QLC #1 is executed. As a result, the foggy-fine write operation for the pages P0 to P3 is completed. As a result, data corresponding to pages P0 to P3 can be correctly read from QLC #1.

(7) Next, next four pages (P20 to P23) of write data is transferred to the NAND flash memory 5 page by page, and a foggy write operation for writing the four pages (P20 to P23) of write data to a plurality of memory cells connected to the word line WL5 in QLC #1 is executed.

(8) When the foggy write operation for the plurality of memory cells connected to the word line WL5 is ended, the word line to be written returns to the word line WL1, and the fine write operation for the plurality of memory cells connected to the word line WL1 can be executed. Then, four pages (P4 to P7) of write data, which is the same as the four pages (P4 to P7) of write data used in the foggy write operation on the word line WL1, is transferred again to the NAND flash memory 5 page by page, and the fine write operation for writing the four pages (P4 to P7) of write data to the plurality of memory cells connected to the word line WL1 in QLC #1 is executed. As a result, the foggy-fine write operation for the pages P4 to P7 is completed. As a result, data corresponding to pages P4 to P7 can be correctly read from QLC #1.

Note that, although the case where four pages of data is transferred to the NAND flash memory 5 in each of the foggy write operation and the fine write operation is described here, in a case where QLC #1 includes two QLC physical blocks each selected from two planes included in the NAND flash memory 5, the writing to the two QLC physical blocks is simultaneously executed. Therefore, in each of the foggy write operation and the fine write operation, eight pages of data is transferred to the NAND flash memory 5.

Figure 7:
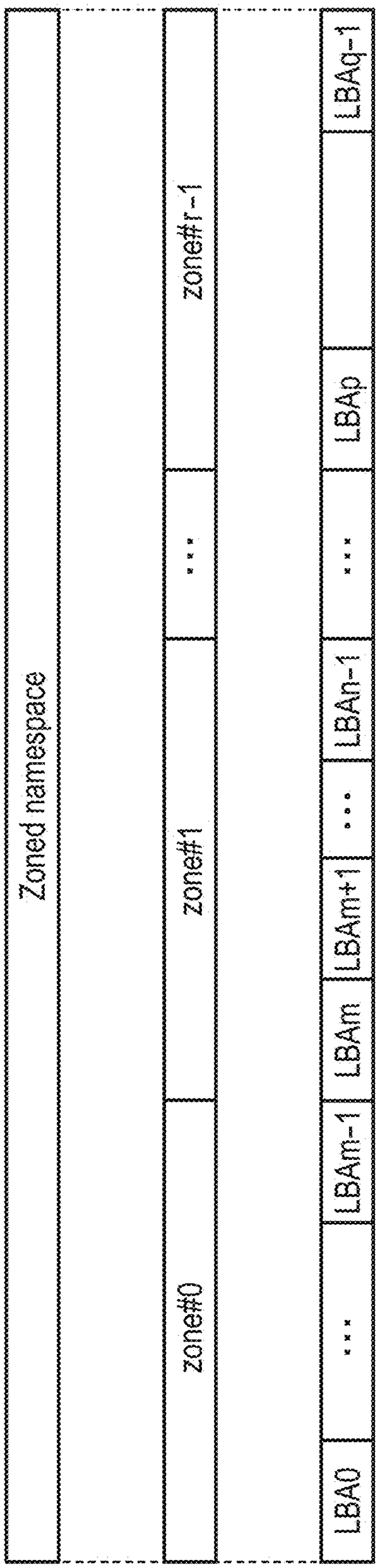
FIG. 7 is a diagram illustrating an example of a configuration of a zoned namespace defined by a standard of NVMe.

Next, a configuration of a plurality of zones will be described. FIG. 7 is a diagram illustrating an example of a configuration of a zoned namespace defined by the standard of NVMe.

The logical block address range of each zoned namespace starts from the LBA 0. For example, the logical block address range of the zoned namespace of FIG. 7 includes q consecutive LBAs from the LBA 0 to the LBA q−1. The zoned namespace is divided into r zones from zone #0 to zone #r−1. These r zones include consecutive non-overlapping logical block addresses.

More specifically, the zone #0, the zone #1, and the zone #r−1 are allocated to this zoned namespace. The LBA 0 indicates the minimum LBA of the zone #0. The LBA q−1 indicates the maximum LBA of the zone #r−1. The zone #0 includes the LBA 0 and the LBA m−1. The LBA 0 indicates the minimum LBA of the zone #0. The LBA m−1 indicates the maximum LBA of the zone #0. The zone #1 includes the LBA m, the LBA m+1, . . . the LBA n−2, and the LBA n−1. The LBA m indicates the smallest LBA of the zone #1. The LBA n−1 indicates the maximum LBA of the zone #1. The zone #r−1 includes the LBA p, . . . , and the LBA q−1. The LBA p indicates the smallest LBA in the zone #r−1. The LBA q−1 indicates the maximum LBA of the zone #r−1.

The controller 4 allocates one of the plurality of QLC blocks to each of the plurality of zones as a physical storage region. Further, the controller 4 manages the mapping between each of the plurality of QLC blocks and each of the plurality of zones using a Z2P table 61.

For example, when a write command for writing data to a certain zone is received from the host 2, the controller 4 determines a QLC block allocated to this zone as a write destination block, and writes data associated with the received write command to this write destination block. When a write command for writing data to another zone is received from the host 2, the controller 4 determines a QLC block allocated to said another zone as a write destination block, and writes data associated with the received write command to this write destination block.

The write command includes, for example, a logical address (start LBA) indicating a first sector to which the write data is to be written, a data size of the write data, and a data pointer (buffer address) indicating a position in the host write buffer 1021 in which the write data is stored.

For example, a high-order bit portion of a logical address (start LBA) included in the write command is used as an identifier specifying a zone in which write data associated with the write command is to be written, that is, a zone start logical block address (ZSLBA) of the zone. Since a QLC block is allocated to each zone, the ZSLBA is also used as an identifier specifying the QLC block to which data is to be written. In addition, the low-order bit portion of the logical address (start LBA) included in the write command is used as the write destination LBA (offset) in the zone to which the write data is to be written. Therefore, the logical address specified by the write command indicates both one zone among the plurality of zones and an offset from the head of this zone to the write destination location in this zone. Note that a zone append command specifying only ZSLBA may be used as the write command. In this case, the write destination LBA (offset) in the zone is determined by the controller 4 so that the writing in this zone is sequentially performed.

The data size of the write data may be specified by, for example, the number of sectors (logical blocks). One sector corresponds to the minimum data size of the write data that can be specified by the host 2. That is, the data size of the write data is represented by a number of the sector.

The value of the next writable LBA in each zone is managed by the write pointer corresponding to each zone.

Figure 8:
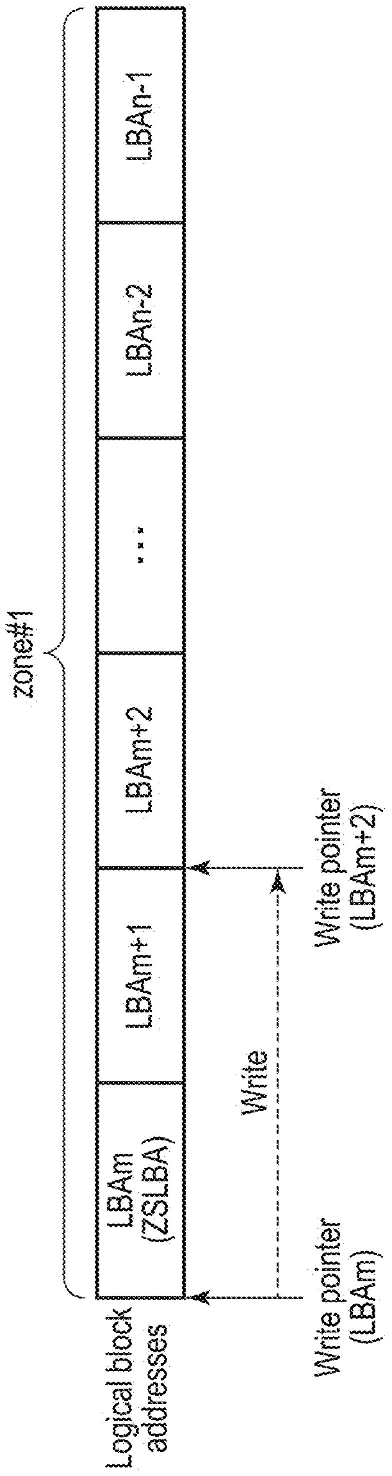
FIG. 8 is a diagram illustrating an update operation of a write pointer executed in the memory system according to the embodiment.

Next, an update operation of the write pointer will be described. FIG. 8 is a diagram illustrating an update operation of the write pointer executed in the memory system according to the embodiment.

The controller 4 manages a plurality of write pointers corresponding to a plurality of respective zones. Each write pointer indicates the next writable LBA in the zone corresponding to the write pointer. When data is sequentially written to a certain zone, the controller 4 increases the value of the write pointer corresponding to this zone by the number of logical blocks to which the data is written.

Here, the update operation of the write pointer will be described using the zone #1 as an example. The zone #1 includes a logical block address range from the LBA m to the LBA n−1. The LBA m is the smallest logical block address of the zone #1, that is, the zone start logical block address (ZSLBA) of the zone #1. When the zone #1 is in an empty state in which valid data is not included, the write pointer corresponding to the zone #1 indicates the LBA m that is the zone start logical block address of the zone #1. When receiving a command for opening the zone #1 from the host 2, the controller 4 changes the state of the zone #1 to an open state in which data can be written. In this case, the controller 4 allocates one of the QLC blocks in the empty state (free QLC blocks) not including valid data as the open physical storage region associated with the zone #1, and executes the erase operation on this one QLC block. As a result, this one QLC block is opened as a write destination QLC block. As a result, writing to the zone #1 is possible.

When the write destination location (start LBA) specified by the write command specifying the zone #1 is equal to the write pointer (here, LBA m) of the zone #1, the controller 4 writes data in the LBA range starting from the specified start LBA, for example, the LBA m and the LBA m+1.

The controller 4 updates the write pointer of the zone #1 so that the value of the write pointer of the zone #1 increases by the number of logical blocks to which data is written. For example, when data is written to the LBA m and the LBA m+1, the controller 4 updates the value of the write pointer to the LBA m+2. The LBA m+2 indicates the smallest LBA among the unwritten LBAs in the zone #1, that is, the next writable LBA in the zone #1.

In a case where data is written again to a certain LBA range in the zone #1 to which data has already been written, it is necessary to reset the zone #1, return the value of the write pointer to the LBA m, and open the zone #1 again.

The commands received by the controller 4 from the host 2 include a read command, an open zone command, a closed zone command, a reset zone command, and the like in addition to the write command.

The read command is a command (read request) that reads data from the NAND flash memory 5. The read command includes a logical address (start LBA) indicating a first sector from which data (data to be read) is to be read, a data size of the data to be read, and a data pointer (buffer address) indicating a position in the read buffer of the host 2 to which the data to be read is to be transferred. The read buffer of the host 2 is a memory region provided in the memory 102 of the host 2.

A high-order bit portion of the logical address included in the read command is used as an identifier specifying a zone in which the read target data is stored. Further, the low-order bit portion of the logical address included in the read command specifies an offset in the zone in which the read target data is stored.

The open zone command is a command (open request) for causing one of a plurality of zones each in an empty state transitioning to an open state available in writing data. That is, the open zone command is used to transition a specific block group that is in an empty state not including valid data to an open state available in writing data.

The open zone command includes a logical address specifying a zone to be caused transitioning to the open state. For example, the high-order bit portion of the logical address specified by the open zone command is used as an identifier specifying a zone to be caused transitioning to the open state.

The closed zone command is a command (close request) for causing one of the zones in the open state transitioning to the closed state in which writing is suspended. The closed zone command includes a logical address specifying a zone to be caused transitioning to the closed state. For example, the high-order bit portion of the logical address specified by the closed zone command is used as an identifier specifying the zone to be caused transitioning to the closed state.

The reset zone command is a command (reset request) for resetting a zone in which rewriting is to be performed and causing the zone transitioning to an empty state. For example, the reset zone command is used to cause a zone in a full state filled with data transitioning to an empty state not including valid data. The valid data means data associated with the logical address. The reset zone command includes a logical address specifying a zone to be caused transitioning to the empty state. For example, a high-order bit portion of a logical address specified by the reset zone command is used as an identifier specifying a zone to be caused transitioning to the empty state. The value of the write pointer corresponding to the zone transitioning to the empty state by the reset zone command is set to a value indicating the ZSLBA of this zone.

For example, when the zone #1 is reset, the controller 4 can treat the QLC block allocated as the physical storage region for the zone #1 as a free QLC block not including valid data. Therefore, the QLC block can be reused for writing data only by performing the erase operation on the QLC block.

Figure 9:
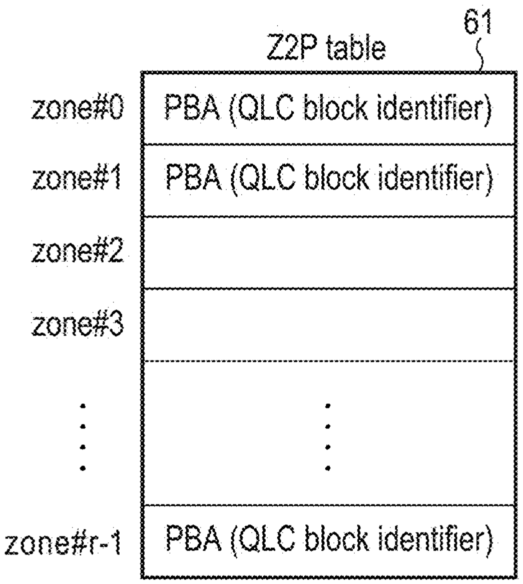
FIG. 9 is a diagram illustrating an example of a configuration of a management table that is used in the memory system according to the embodiment and holds a correspondence relationship between each of a plurality of zones and each of a plurality of QLC blocks.

FIG. 9 is a diagram illustrating an example of a configuration of the Z2P table 61 which is a management table for managing a correspondence relationship between each of a plurality of zones and each of a plurality of QLC blocks that is used in the storage device according to the embodiment.

The Z2P table 61 has a plurality of entries corresponding to a plurality of zones included in any zoned namespace. In FIG. 9, the Z2P table 61 has r entries for managing r zones.

In each of the plurality of entries, an identifier (QLC block identifier) indicating the QLC block allocated to the zone corresponding to the entry is stored as the physical address PBA of the physical storage region corresponding to this zone. In FIG. 9, the QLC block identifier indicating a QLC block allocated to the zone #0 is stored in the entry corresponding to the zone #0. The QLC block identifier indicating a QLC block allocated to the zone #1 also is stored in the entry corresponding to the zone #1. Further, the QLC block identifier indicating a QLC block allocated to the zone #r−1 is stored in the entry corresponding to the zone #r−1.

Although FIG. 9 illustrates the Z2P table 61 corresponding to a certain zoned namespace, the Z2P table 61 may include entries corresponding to a plurality of zones included in a plurality of zoned namespaces.

As described above, in the SSD 3 conforming to the zoned namespace, the write data is written to the QLC block allocated to the zone specified by the write command received from the host 2. However, in the write operation on the QLC block, a write operation requiring multiple program operations such as the foggy-fine write operation may be performed. At this time, it is necessary to keep data in a storage region other than the QLC block from the first write operation to the last write operation.

In addition, in a case where the SSD 3 is used as a storage device of a server computer, for example, there is a case where a plurality of zones corresponding to a plurality of respective applications (or a plurality of clients) is simultaneously used, for example, so that a plurality of types of data is written to different zones. In this case, the time from the start of writing to the zone to the full state in which the entire zone is filled with data may be different for each zone.

In such a case, when data to be written to a plurality of zones is mixed in one pSLC block, necessary data (valid data) and unnecessary data (invalid data) are mixed in one pSLC block due to a difference in write completion timing for each zone. Data (write-completed data) that has been written to a certain QLC block can be read from the QLC block. Therefore, the write-completed data stored in the pSLC block is unnecessary data. Data (write-incompleted data) that has not been written to a certain QLC block cannot be read from the QLC block. Therefore, the write-incompleted data stored in the pSLC block is necessary data.

When the number of free pSLC blocks available in writing data decreases, it is necessary to execute a garbage collection operation of copying only valid data (write-incompleted data) from a pSLC block in which necessary data and unnecessary data are mixed to another pSLC block.

However, the execution of the garbage collection operation may cause deterioration of write amplification due to occurrence of a write operation to the NAND flash memory 5 regardless of an instruction from the host 2 such as a write command, and increase in latency for a command issued from the host 2 due to use of the NAND flash memory 5.

Therefore, in the present embodiment, the controller 4 allocates a plurality of pSLC blocks to a plurality of QLC blocks opened as write destination blocks. Then, the controller 4 writes only data to be written to the corresponding QLC block to each of the pSLC blocks. Then, the pSLC block holds the written data as the write-incompleted data until the fine write operation related to the data written to the pSLC block is performed. The data written to the pSLC block gradually transitions from the write-incompleted data to the write-completed data as the writing to the corresponding QLC block proceeds. When the entire pSLC block is filled with data and all of the data is write-completed data, the pSLC block is a free block not including valid data.

As described above, by allocating the pSLC block to each QLC block opened as the write destination block, the controller 4 can efficiently write data to the plurality of QLC blocks without increasing the write amplification.

Figure 10:
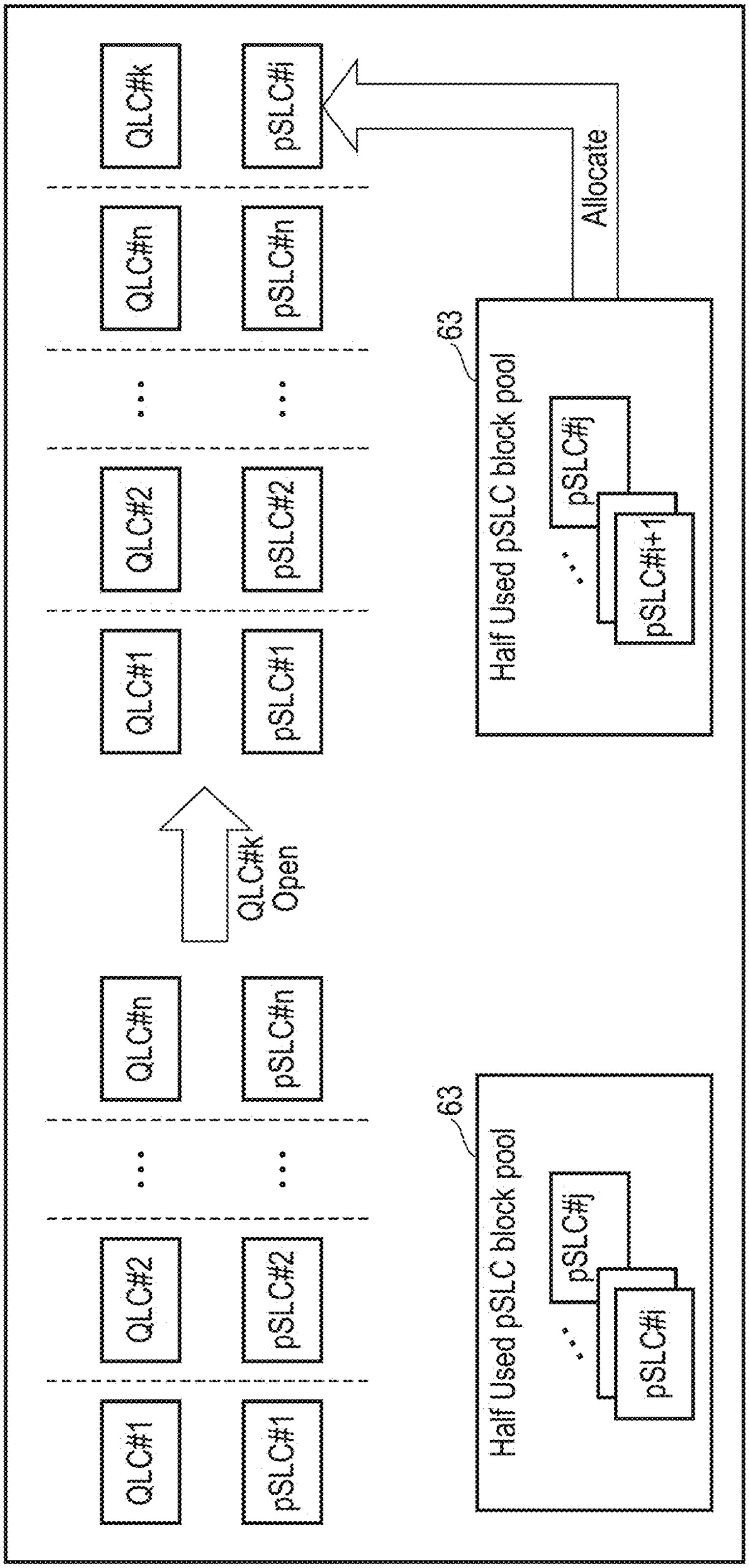
FIG. 10 is a diagram illustrating a pSLC block allocated to each of a plurality of QLC blocks opened as a write destination block in the memory system according to the embodiment.

Next, details of allocation of the pSLC block to the QLC block will be described. FIG. 10 is a diagram illustrating pSLC blocks respectively allocated to a plurality of QLC blocks in the memory system according to the embodiment.

In FIG. 10, n QLC blocks (QLC #1, QLC #2, . . . , and QLC #n) are opened as write destination blocks. n pSLC blocks (pSLC #1, pSLC #2, . . . , and pSLC #n) are allocated to n QLC blocks (QLC #1, QLC #2, . . . , and QLC #n).

In the left part of FIG. 10, pSLC #1 is allocated to QLC #1, pSLC #2 is allocated to QLC #2, and pSLC #n is allocated to QLC #n.

An identifier of a pSLC block that can be newly allocated to the QLC block is stored in a Half Used pSLC block pool 63. The Half Used pSLC block pool 63 is used to manage each of Half Used pSLC blocks including a written region in which writing completion data is stored and an unwritten region. The Half Used pSLC block pool 63 includes a pSLC block selected from the free pSLC block pool 62 and then erased, and a pSLC block deallocated from the QLC block in a state in which the unwritten region is included. Here, the Half Used pSLC block pool 63 includes pSLC blocks, pSLC #i, . . . , and pSLC #j.

In response to opening of the new QLC block (here, QLC #k) as the write destination block, the pSLC block control unit 123 selects any pSLC block (here, pSLC #i) from the Half Used pSLC block pool 63. Then, the pSLC block control unit 123 allocates the selected pSLC #i to QLC #k. Furthermore, in a case where there is no available pSLC block in the Half Used pSLC block pool 63 when a new QLC block is opened, the pSLC block control unit 123 may select any pSLC block from the free pSLC block pool 62. The pSLC block control unit 123 executes an erase operation on the selected pSLC block, and manages the selected pSLC block as a Half Used pSLC block using the Half Used pSLC block pool 63. Alternatively, the pSLC block control unit 123 may execute the erase operation on the selected pSLC block, and directly allocate the selected pSLC block to QLC #k without through the Half Used pSLC block pool 63.

Accordingly, pSLC #i is allocated to QLC #k as a dedicated write buffer for QLC #k. In this case, data to be written to another QLC block is not written to pSLC #i, and only data to be written to QLC #k is written to pSLC #i.

Figure 11:
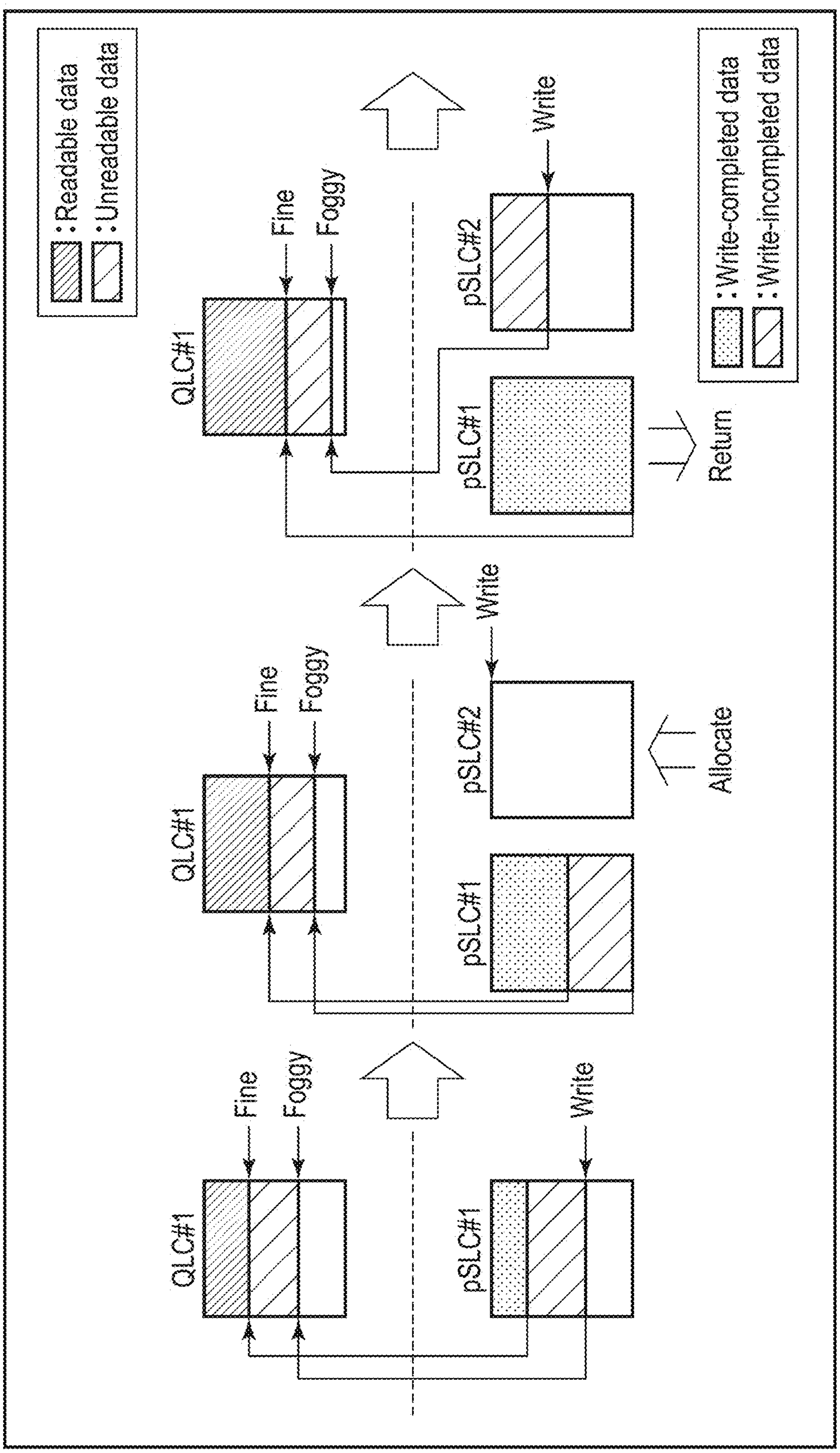
FIG. 11 is a first diagram for describing the write operation on a certain QLC block executed in the memory system according to the embodiment.
Figure 12:
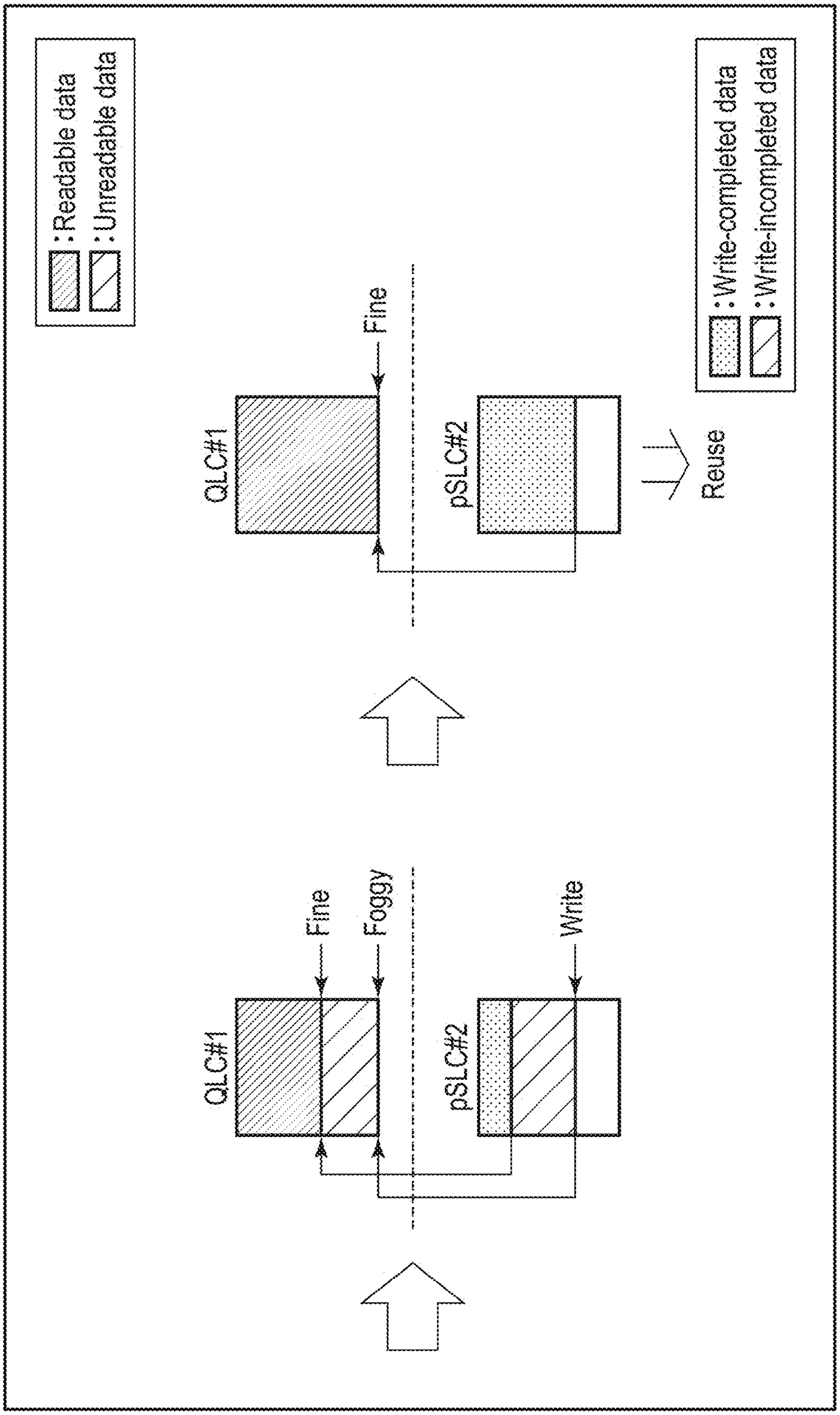
FIG. 12 is a second diagram for explaining the write operation on a certain QLC block executed in the memory system according to the embodiment.

Next, a specific write operation and deallocation of the pSLC block will be described with reference to FIGS. 11 and 12. FIG. 11 is a first diagram for describing the write operation on a certain QLC block performed in the memory system according to the embodiment. In FIG. 11, data writing to QLC #1 and pSLC #1 allocated to QLC #1 will be described. Among the data written to QLC #1, the data for which the fine write operation has been completed is readable data. Further, among the data written to QLC #1, data for which the foggy write operation is completed but the fine write operation is not completed is unreadable data. In the storage region of QLC #1, the storage region to which no data is written is an unwritten region.

Among the data written to pSLC #1, the data for which the fine write operation on QLC #1 has been completed is write-completed data. Among the data written to pSLC #1, data for which the fine write operation on QLC #1 is not completed is write-incompleted data. In the storage region of pSLC #1, the storage region to which no data is written is an unwritten region.

When the fine write operation on a certain word line of QLC #1 is performable, the flash management unit 121 executes the fine write operation on QLC #1 using the write-incompleted data stored in pSLC #1. The write-incompleted data is data already used for the foggy write operation on the word line of QLC #1. Then, when the fine write operation on the word line is completed, the data in pSLC #1 used for the fine write operation becomes write-completed data.

The flash management unit 121 writes data to be written to QLC #1 to the pSLC block #1 until there is no unwritten region in pSLC #1. The data of pSLC #1 for which the fine write operation on QLC #1 is completed is write-completed data. When there is no unwritten region for pSLC #1, the pSLC block control unit 123 allocates a new pSLC block (here, pSLC #2) to QLC #1. Here, the pSLC block control unit 123 selects any pSLC block from the Half Used pSLC block pool 63, and allocates the selected pSLC block to QLC #1. In addition, when there is no pSLC block available in writing data in the Half Used pSLC block pool 63, the pSLC block control unit 123 selects any free pSLC block from the free pSLC block pool 62, and allocates the selected free pSLC block to QLC #1. Here, a case where the pSLC block control unit 123 newly allocates pSLC #2 having no write-completed data to QLC #2 is assumed.

The pSLC block control unit 123 may select pSLC #2 from the free pSLC block pool 62, execute the erase operation on pSLC #2, then move pSLC #2 to the Half Used pSLC block pool 63, and allocate pSLC #2 to QLC #1, or may execute the erase operation on pSLC #2, and then directly allocate pSLC #2 to QLC #1.

Next, the flash management unit 121 writes data to be written to QLC #1 to pSLC #2 as writing incomplete data. The flash management unit 121 executes the foggy write operation on QLC #1 using the data written to pSLC #2. Then, when the fine write operation is executable in response to executing the foggy write operation, the flash management unit 121 executes the fine write operation on QLC #1. By executing the fine write operation on QLC #1, part of the write-incompleted data in pSLC #1 becomes the write-completed data. When all the data stored in pSLC #1 becomes the write-completed data, the pSLC block control unit 123 deallocates pSLC #1 from QLC #1 and returns the deallocated pSLC #1 to the free pSLC block pool 62.

Next, a subsequent operation will be described with reference to FIG. 12. The flash management unit 121 executes the foggy write operation on QLC #1 until there is no unwritten region in QLC #1. Then, when the fine write operation is executable in response to executing the foggy write operation, the flash management unit 121 executes the fine write operation on QLC #1.

Next, the flash management unit 121 executes the remaining fine write operation on QLC #1. When the fine write operation on all the word lines of QLC #1 is completed, QLC #1 is filled with data that has been written to QLC #1. As a result, all the data in QLC #1 becomes readable data. Then, all the write-incompleted data in pSLC #2 becomes the write-completed data.

At this time, pSLC #2 includes the unwritten region and does not include the write-incompleted data. Therefore, even when write-incompleted data to be written to a write destination QLC block other than QLC #1 is written to the unwritten region of pSLC #2, the write-incompleted data to be written to a different QLC block is not mixed in pSLC #2. The pSLC block control unit 123 deallocates pSLC #2 from QLC #1, and returns the deallocated pSLC #2 to the Half Used pSLC block pool 63.

As a result, for example, when a new QLC block is opened, pSLC #2 is reused to be allocated to the QLC block as a write buffer. When pSLC #2 is selected to be allocated to the QLC block, pSLC #2 is allocated to the QLC block without the erase operation performed. Then, the flash management unit 121 writes data to be written to the QLC block to the remaining unwritten region of pSLC #2.

Figure 13:
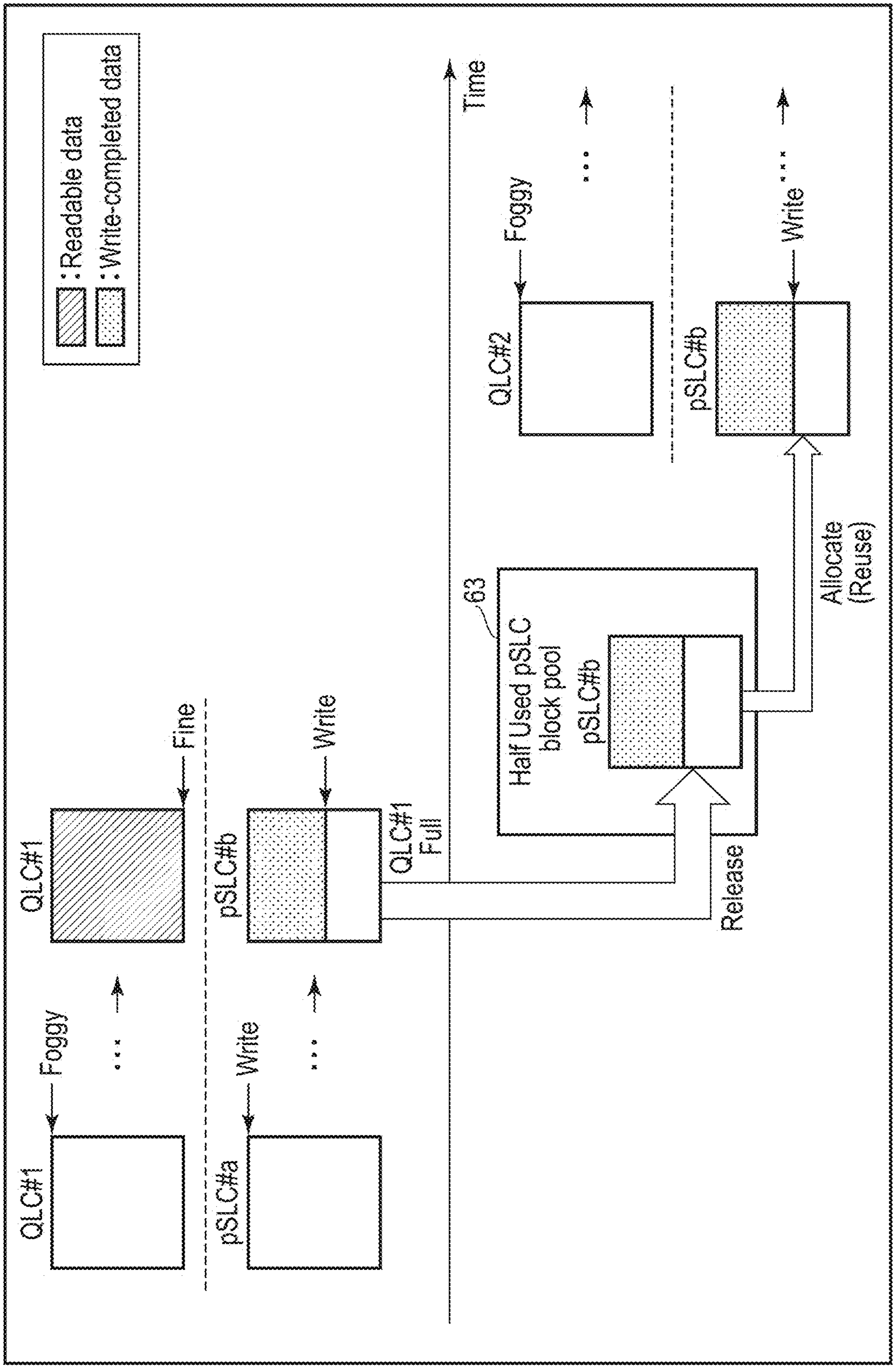
FIG. 13 is a diagram illustrating a pSLC block that is reused by being allocated to another QLC block after an allocation to a certain QLC block is released in the memory system according to the embodiment.

Next, reuse of the pSLC block will be described. FIG. 13 is a diagram illustrating a pSLC block that is reused by being allocated to another QLC block after the allocation to a certain QLC block is released in the memory system according to the embodiment.

First, when QLC #1 is opened, the pSLC block control unit 123 allocates pSLC #a to QLC #1. Then, the flash management unit 121 executes the write operation on QLC #1 and pSLC #a similarly to the operation described with reference to FIGS. 11 and 12. When there is no unwritten region in pSLC #a, the pSLC block control unit 123 allocates a new pSLC to QLC #1. When there is no unwritten region in the new pSLC, the pSLC block control unit 123 further allocates a new pSLC to QLC #1. In this way, the pSLC block control unit 123 sequentially allocates some pSLCs to QLC #1 while returning the pSLC filled with the write-completed data to the free pSLC block pool 62 according to the progress of writing to QLC #1. For example, when pSLC #b is allocated to QLC #1, data to be written to QLC #1 is written to pSLC #b. Then, when the writing to QLC #1 progresses and all the data in QLC #1 become the readable data, all the data in pSLC #b also become the write-completed data. At this time, when there is an unwritten region in pSLC #b, the pSLC block control unit 123 deallocates pSLC #b from QLC #1. Then, the pSLC block control unit 123 returns the deallocated pSLC #b to the Half Used pSLC block pool 63.

Thereafter, in response to the newly opened QLC block QLC #2, the pSLC block control unit 123 selects pSLC #b in the Half Used pSLC block pool 63, and allocates pSLC #b to QLC #2. Then, the flash management unit 121 writes data to be written to QLC #2 to the unwritten region of pSLC #b.

As a result, the controller 4 can allocate pSLC #b that has been allocated to QLC #1 and used to the newly opened QLC #2 and reuse the allocated pSLC #b. In addition, pSLC #b is allocated to QLC #2, and even when data to be written to QLC #2 is written to pSLC #b, all the data related to QLC #1 remaining in pSLC #b is the write-completed data, and thus, the write-incompleted data to be written to different QLC blocks is not mixed in pSLC #b.

Figure 14:
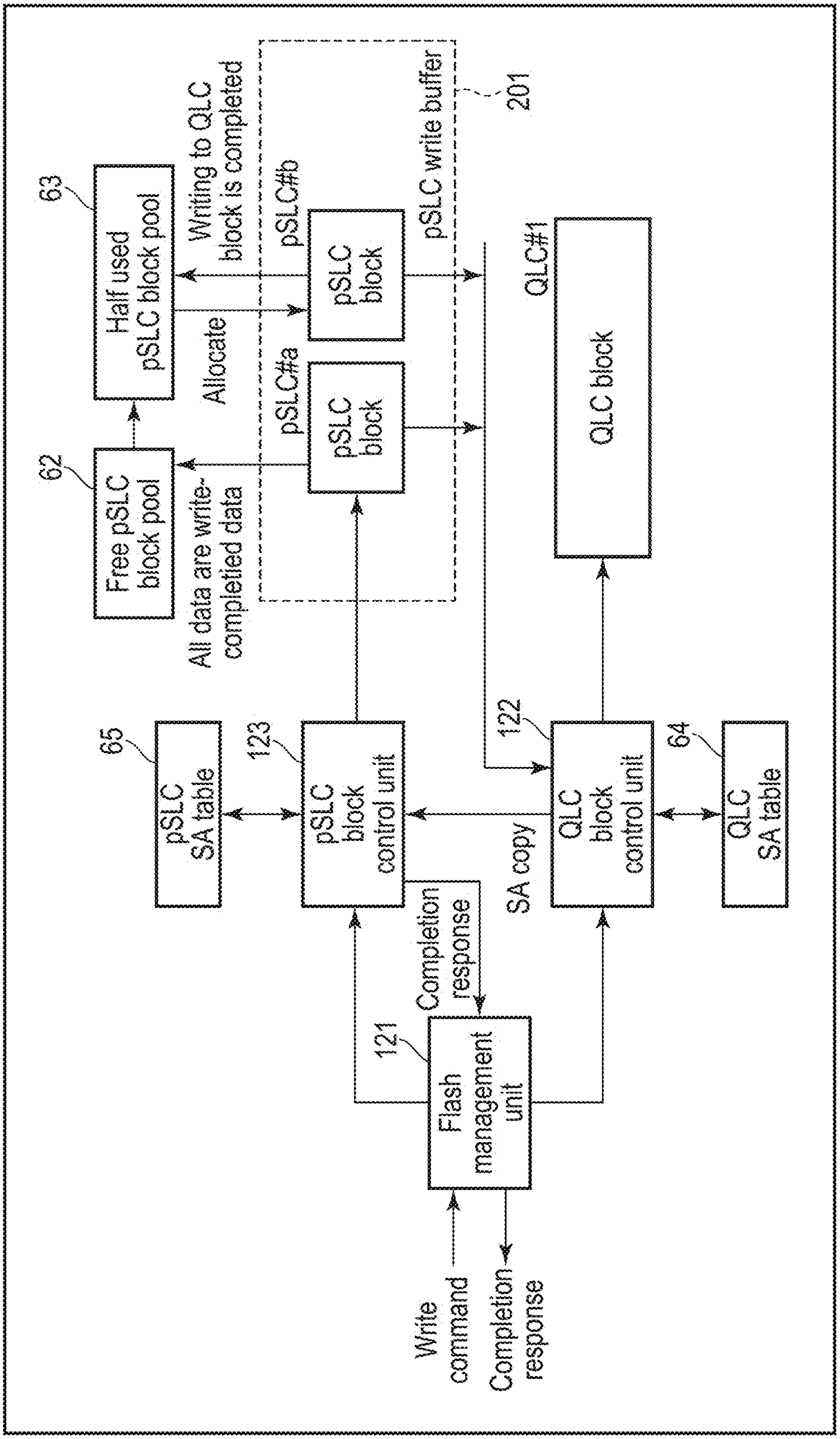
FIG. 14 is a diagram illustrating a relationship between a certain QLC block and a plurality of pSLC blocks allocated to the QLC block in the memory system according to the embodiment.

FIG. 14 is a diagram illustrating a relationship between a certain QLC block and a plurality of pSLC blocks allocated to the QLC block in the memory system according to the embodiment. A relationship between QLC #1 and a plurality of pSLC blocks allocated to QLC #1 will be described below.

First, when a write command specifying QLC #1 is received from the host 2, The flash management unit 121 notifies the QLC block control unit 122 of information about the received write command, for example, the size of data associated with the received write command, information indicating the position in the host write buffer 1021 where the data is stored, and the like.

The QLC block control unit 122 updates the QLC SA table 64 based on the received information about the write command. The QLC SA table 64 is used to hold a plurality of source addresses SA. Each of the plurality of source addresses SA indicates a position where data to be written to QLC #1 is stored. The QLC block control unit 122 stores, in the QLC SA table 64, information indicating a position in the host write buffer 1021 in which data associated with the write command is stored as the source address SA.

When the total size of the data associated with one or more received write commands specifying QLC #1 reaches the second minimum write size, the flash management unit 121 updates the pSLC SA table 65 of the pSLC block control unit 123 by copying all the source addresses SA stored in the QLC SA table 64 to the pSLC SA table 65. Each source address SA of the pSLC SA table 65 indicates a position where data to be written to the pSLC block allocated to QLC #1 is stored.

The flash management unit 121 acquires data associated with one or more received write commands, that is, data having the second minimum write size to be written to QLC #1 from the host write buffer 1021 based on each source address SA of the pSLC SA table 65. Then, the flash management unit 121 writes the acquired data to the pSLC block (here, pSLC #a).

When data is written to pSLC #a, the flash management unit 121 transmits, to the host 2, one or more completion responses indicating completion of one or more write commands corresponding to the data.

When the data having the second minimum write size is written to pSLC #a, the flash management unit 121 updates the QLC SA table 64 so that each source address SA of the data to be written to QLC #1 is changed from a position in the host write buffer 1021 to a position in pSLC #a in which the data is written.

At this time, when a read command specifying the data as read target data is received from the host 2, the flash management unit 121 reads the read target data from pSLC #a based on the source address SA corresponding to the data to be read to transmit the data to be read to the host 2. Before this data is written to pSLC #a, the source address SA corresponding to this data indicates the position in the host write buffer 1021. Therefore, if a read command specifying this data as read target data is received from the host 2 before the data is written to pSLC #a, the flash management unit 121 reads this read target data from the host write buffer 1021 based on the source address SA corresponding to the read target data to transmit the read target data to the host 2.

When the total size of the data written to pSLC #a reaches the first minimum write size, the flash management unit 121 reads data having the first minimum write size to be written to QLC #1 from pSLC #a based on each source address SA of the QLC SA table 64. Then, the flash management unit 121 writes the read data to QLC #1 by the foggy write operation.

When the writing to QLC #1 proceeds and the fine write operation on a certain word line in QLC #1 can be executed, the flash management unit 121 reads data to be written to this word line again from pSLC #a. Then, the flash management unit 121 writes the read data to QLC #1 by the fine write operation.

By repeating such an operation, there is no unwritten region in pSLC #a in due course. In this case, the pSLC block control unit 123 selects any pSLC block (here, pSLC #b) from the Half Used pSLC block pool 63, and allocates the selected pSLC #b to QLC #1. When all the data which are written to pSLC #a become the write-completed data, the pSLC block control unit 123 returns pSLC #a to the free pSLC block pool 62.

When the entire QLC #1 is filled with data that has been written to QLC #1, that is, readable data in a state where pSLC #b is allocated to QLC #1, the pSLC block control unit 123 returns pSLC #b to the Half Used pSLC block pool 63.

By the above operation, the host 2 can release the memory region in the host write buffer 1021 storing the data associated with the write command related to the completion response at the timing of receiving the completion response. Since the controller 4 transmits a completion response to the host 2 for each piece of data having the minimum write size of the pSLC block smaller than the minimum write size of the QLC block, the required size of the host write buffer 1021 can be reduced as compared with the case where the completion response is transmitted to the host 2 after the writing of the data corresponding to the minimum write size of the QLC block is completed.

Here, the number of times of data transfer executed between the NAND flash memory 5 and the controller 4 will be considered.

When the write operation described with reference to FIG. 14 is executed, five times of data transfer are required: (1) data transfer from the controller 4 to the NAND flash memory 5, which is executed to write data to the pSLC block, (2) data transfer from the NAND flash memory 5 to the controller 4, which is executed to read data from the pSLC block for foggy writing, (3) data transfer from the controller 4 to the NAND flash memory 5, which is executed to write data to the QLC block for foggy writing, (4) data transfer from the NAND flash memory 5 to the controller 4, which is executed to read data from the pSLC block for fine writing, and (5) data transfer from the controller 4 to the NAND flash memory 5, which is executed to write data for fine writing.

When the data written to the pSLC block is used for the write operation to the QLC block, the controller 4 is required to read the data from the pSLC block in order to execute error correction on the data written to the pSLC block. Therefore, data transfer between the controller 4 and the NAND flash memory 5 is executed twice at the time of the foggy write and the fine write.

Therefore, the bandwidth to be used is five times as large as that when the write data is transferred from the controller 4 to the NAND flash memory 5 only once.

In the SSD 3 in the present embodiment, a temporary write buffer (TWB) 161 in the SRAM 16 and a large write buffer (LWB) 66 in the DRAM 6 are used in order to reduce the consumed bandwidth.

Figure 15:
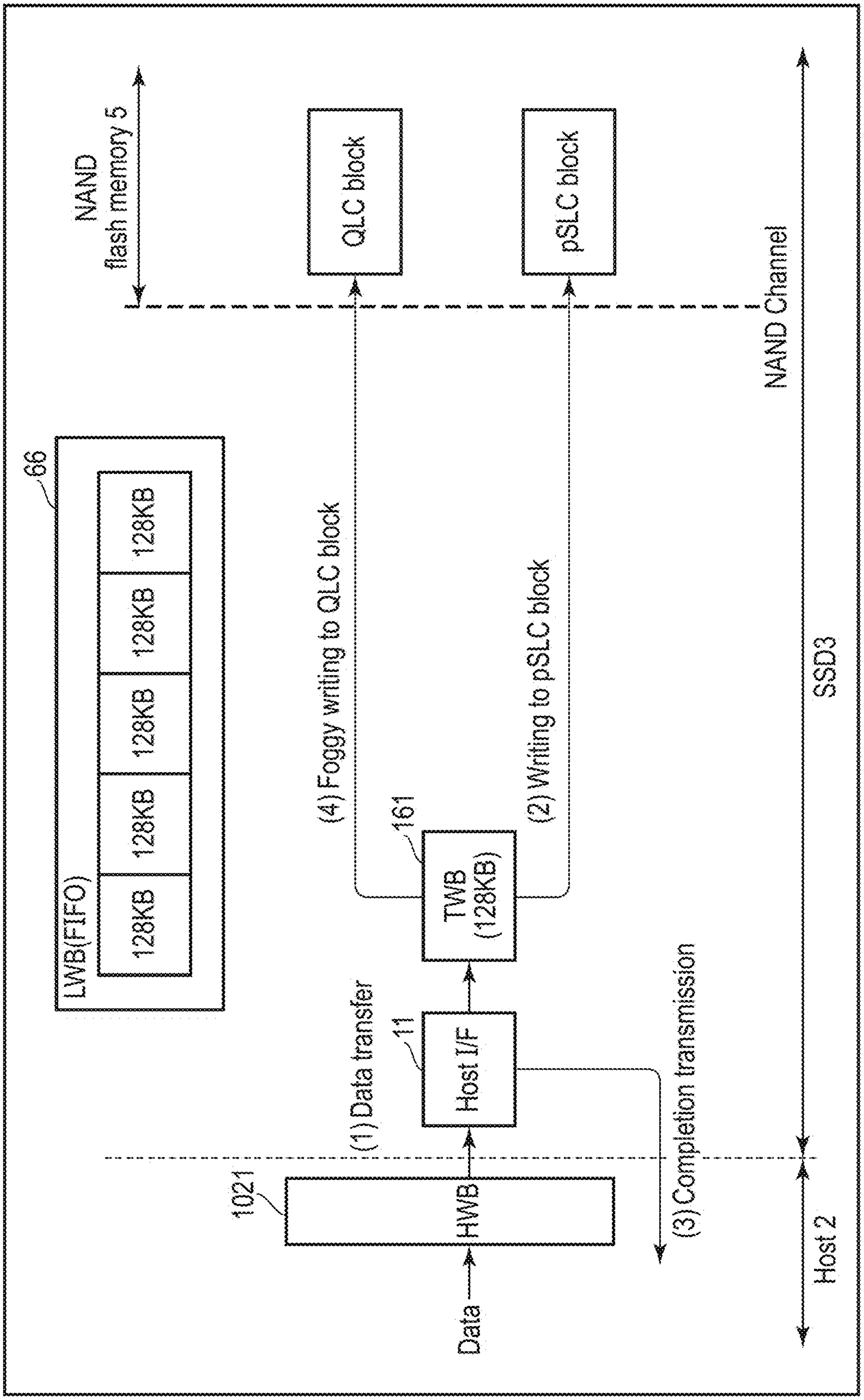
FIG. 15 is a diagram illustrating a foggy write operation executed using a temporary write buffer (TWB) in the memory system according to the embodiment.

FIG. 15 is a diagram illustrating a foggy write operation executed using the TWB in the memory system according to the embodiment.

(1) The flash management unit 121 calculates a total size of write data associated with one or more received write commands specifying a certain QLC block. The flash management unit 121 waits until the total size of the write data associated with one or more received write commands specifying this QLC block reaches the first minimum write size. When the total size of the write data associated with the one or more received write commands specifying this QLC block reaches the first minimum write size, the flash management unit 121 transfers the write data having the first minimum write size and associated with the one or more write commands from the host write buffer 1021 to the TWB 161 via the host interface 11.

The TWB 161 holds data to be written to the QLC block until the foggy write operation to the QLC block is completed. The size of the memory region of the TWB 161 is, for example, the same as the minimum write size (first minimum write size) of the QLC block (for example, 128 KB).

(2) The controller 4 executes the write operation on the pSLC block by transferring the data having the first minimum write size transferred to the TWB 161 to the pSLC block.

(3) In response to completion of the write operation to the pSLC, the controller 4 transmits one or more completion responses to one or more write commands to the host 2 via the host interface 11. The data written to the pSLC block is already readable data. Therefore, the controller 4 can transmit a completion response.

(4) The controller 4 executes foggy writing to the QLC block by transferring the data having the first minimum write size transferred to the TWB 161 to the QLC block. Thereafter, the controller 4 releases the memory region of the TWB 161 in response to the completion of the foggy write operation.

As described above, by using the TWB 161, the controller 4 can execute the foggy write operation on the QLC block without reading the data stored in the pSLC block. As a result, the number of times of data transfer required to be executed between the controller 4 and the NAND flash memory 5 can be reduced.

In order to further reduce the number of times of data transfer required to be executed between the controller 4, the controller 4, and the NAND flash memory 5, the SSD 3 can use a large write buffer (LWB) 66. The LWB 66 is a first-in-first-out (FIFO) volatile memory in which each entry has a memory region with the same size as the TWB 161. Here, the LWB 66 has 5 entries. The number of entries in the LWB 66 is determined so that the QLC block can store data of a size that enables the fine write operation to be executed. For example, when the SSD 3 executes a foggy-fine write operation of reciprocating between two word lines, the LWB 66 may have two entries. In addition, when the SSD 3 executes the foggy-fine write operation of reciprocating between five word lines, the LWB 66 may have five entries.

Figure 16:
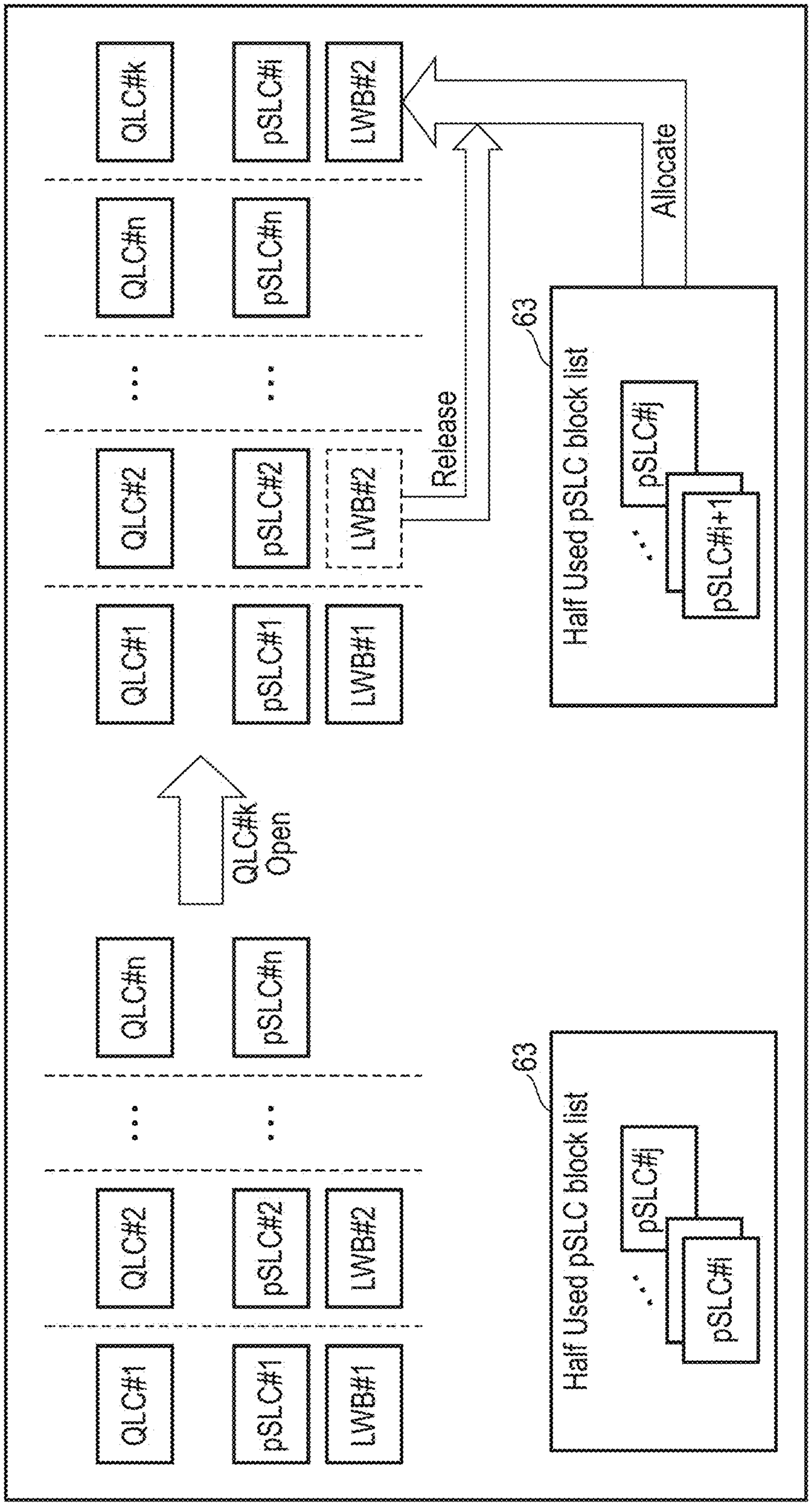
FIG. 16 is a diagram illustrating a pSLC block allocated to each of a plurality of QLC blocks and a large write buffer (LWB) in the memory system according to the embodiment.

Next, an operation of allocating the LWB 66 to the QLC block will be described. FIG. 16 is a diagram illustrating the pSLC block allocated to each of the plurality of QLC blocks and the LWB in the memory system according to the embodiment.

In FIG. 16, the QLC blocks, QLC #1, QLC #2, . . . and QLC #n, are opened and allocated to the zones. A pSLC block is allocated to each QLC block.

In the left part of FIG. 16, pSLC #1 is allocated to QLC #1, pSLC #2 is allocated to QLC #2, and pSLC #n is allocated to QLC #n.

In the Half Used pSLC block pool 63, there is a pSLC block that can be newly allocated to the QLC block. The Half Used pSLC block pool 63 includes a pSLC block selected from the free pSLC block pool 62 and then erased, and a pSLC block deallocated from the QLC block in a state in which the unwritten region is included. Here, the Half Used pSLC block pool 63 includes pSLC blocks, pSLC #i, . . . , and pSLC #j. Further, the LWB 66 includes a large write buffer LWB #1 and a large write buffer LWB #2. The LWB #1 is allocated to QLC #1, and the LWB #2 is allocated to QLC #2.

Here, in response to the newly opened QLC block QLC #k, the pSLC block control unit 123 selects any pSLC block (pSLC #i) from the Half Used pSLC block pool 63. Then, the pSLC block control unit 123 allocates the selected pSLC #i to QLC #k.

Then, the controller 4 selects any LWB out of the LWB #1 and the LWB #2. For example, the controller 4 may select an LWB in which timing of writing the latest data is older (here, LWB #2). Then, the controller 4 deallocates the LWB #2 from QLC #2, and allocates the LWB #2 to the newly opened QLC #k. As a result, the controller 4 can preferentially allocate the LWB 66 to the newly opened QLC block.

Figure 17:
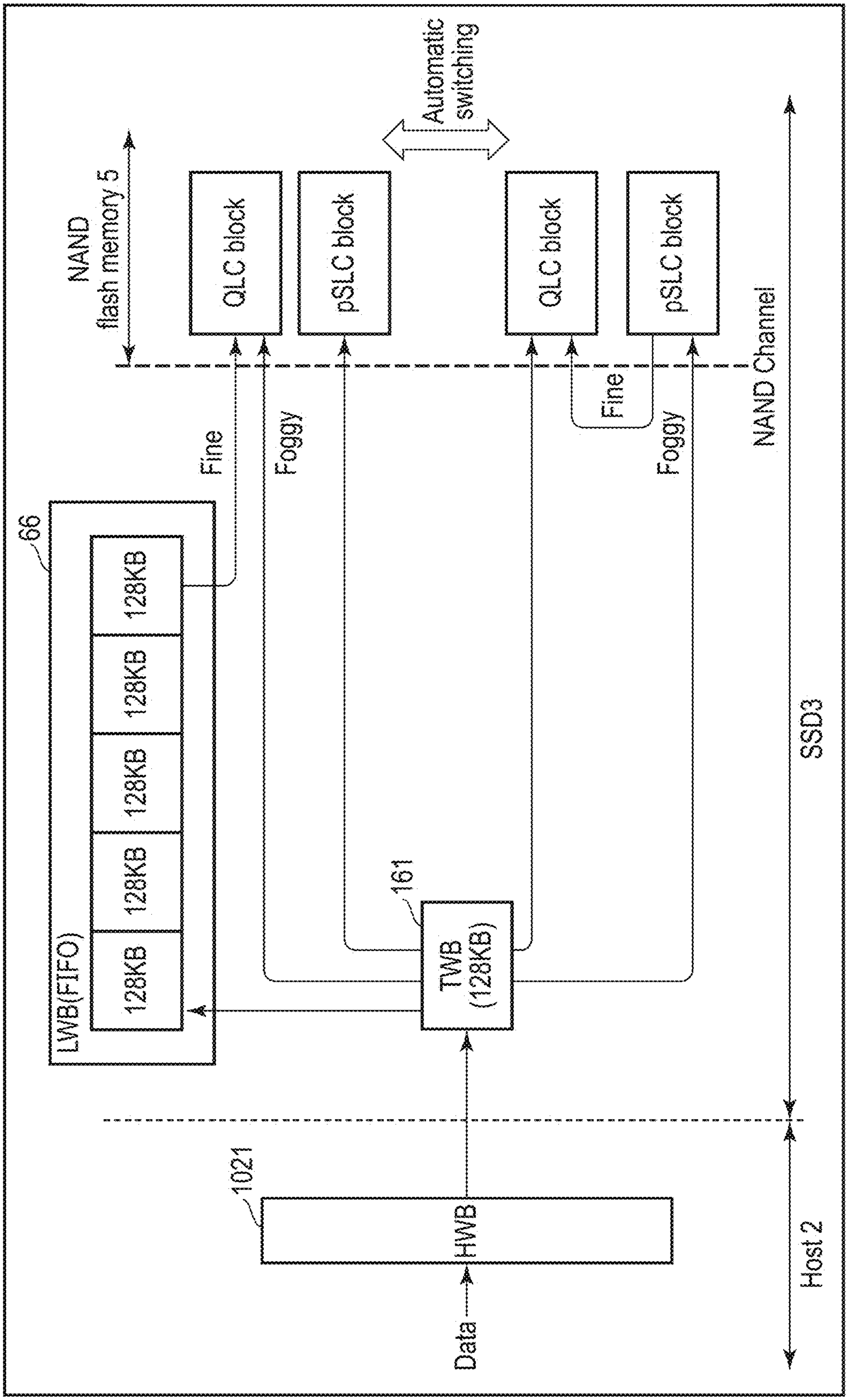
FIG. 17 is a diagram illustrating switching between two types of write operations executed in the memory system according to the embodiment.

FIG. 17 is a diagram illustrating switching between two types of write operations executed in the memory system according to the embodiment. The upper part of FIG. 17 illustrates foggy-fine writing to the QLC block to which the LWB 66 is allocated, and the lower part of FIG. 17 illustrates foggy-fine writing to the QLC block from which allocation of the LWB 66 is released.

When the data to be written to the QLC block to which the LWB 66 is allocated is stored in the TWB 161, the controller 4 copies the data to be written to the QLC block from the TWB 161 to the LWB 66 after completing the foggy write operation on the QLC block. When the fine write operation on the QLC block is executable, the controller 4 executes the fine write operation on the QLC block using the data stored in the LWB 66. Therefore, the QLC block to which the LWB 66 is allocated does not need to read data from the pSLC block when executing not only the foggy write operation but also the fine write operation. Therefore, the consumption of the bandwidth between the controller 4 and the NAND flash memory 5 is further reduced as compared with the QLC block to which the LWB 66 is not allocated.

The LWB 66 need not be allocated to all the opened QLC blocks. In the QLC block from which allocation of the LWB 66 is released as in QLC #2 in FIG. 16, the controller 4 executes the fine write operation on the QLC block using the data read from the pSLC block.

Figure 18:
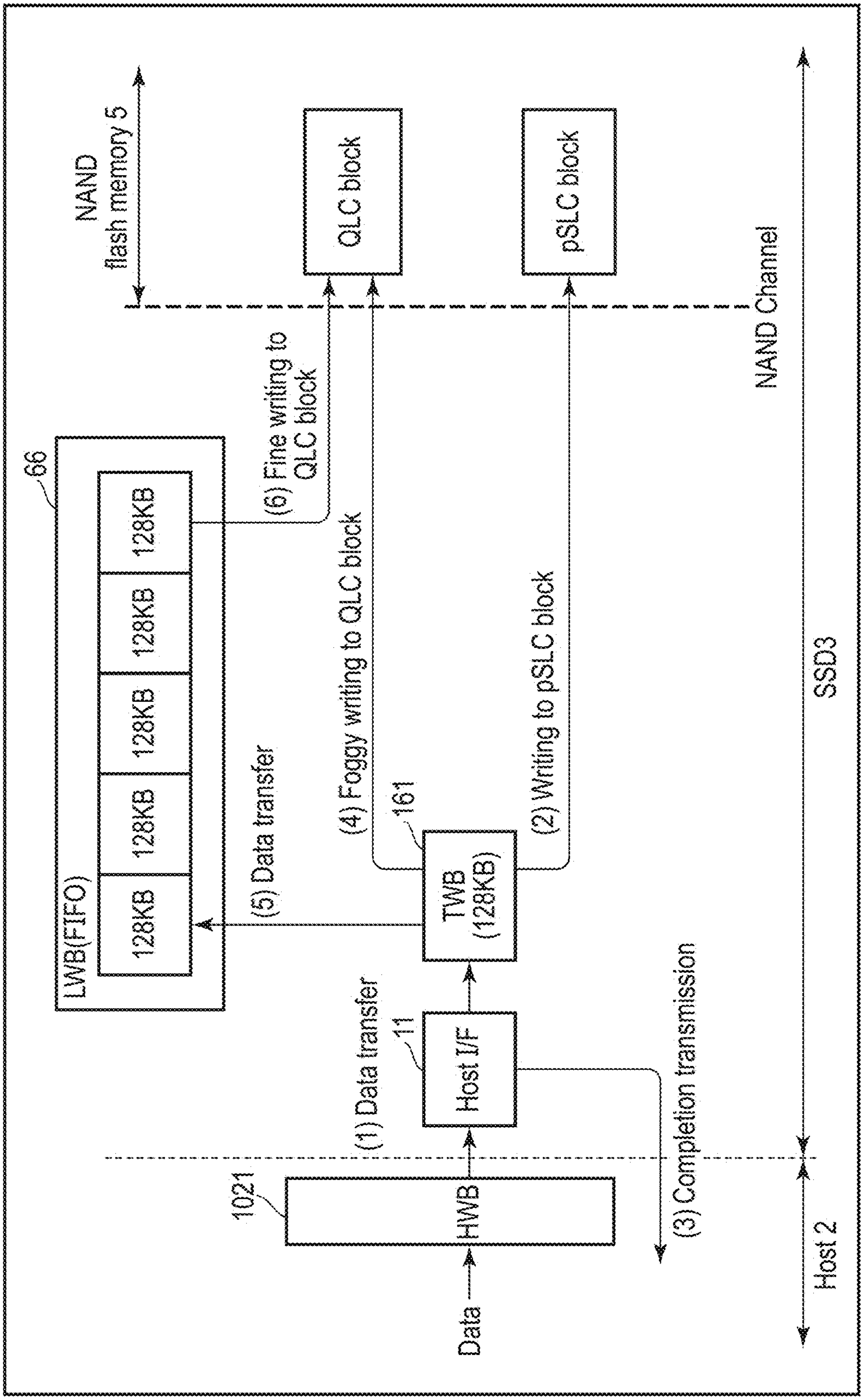
FIG. 18 is a diagram illustrating a write operation executed using both the TWB and the LWB in the memory system according to the embodiment.
Figure 19:
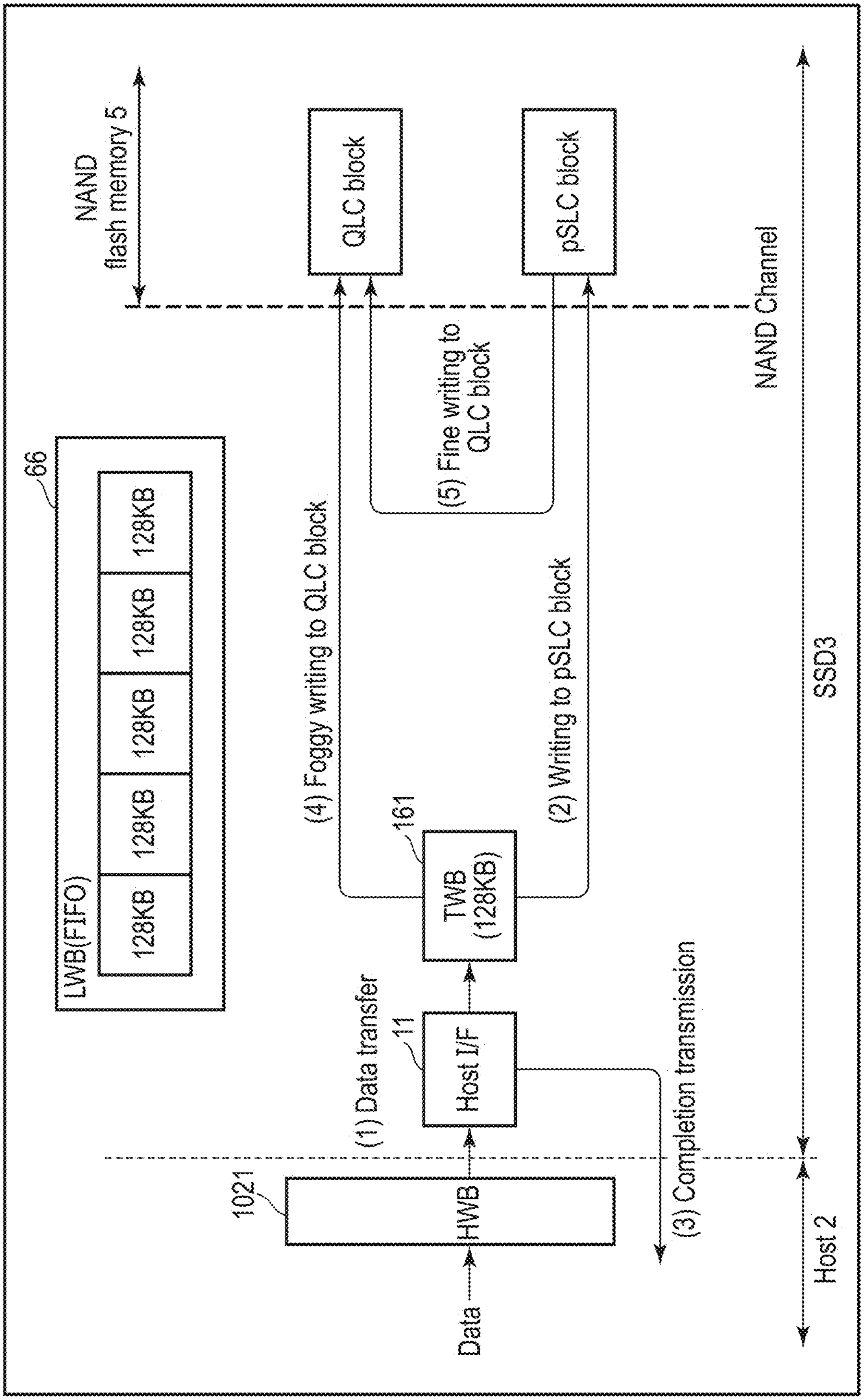
FIG. 19 is a diagram illustrating a write operation executed using the TWB in the memory system according to the embodiment.

The controller 4 executes the foggy-fine write operation illustrated in FIG. 18 or 19 depending on whether the LWB 66 is allocated to the QLC block specified by the write command.

First, details of the foggy-fine write operation on the QLC block to which the LWB 66 is allocated will be described. FIG. 18 is a diagram illustrating a write operation executed using the TWB and the LWB in the memory system according to the embodiment.

(1) The controller 4 receives one or more write commands specifying a certain QLC block from the host 2 via the host interface 11. In response to the total size of data associated with one or more write commands specifying a certain QLC block reaching the minimum write size (first minimum write size) of the QLC block, the controller 4 transfers data having the first minimum write size from the host write buffer 1021 to the TWB 161 via the host interface 11.

(2) The controller 4 executes the write operation on the pSLC block by transferring the data having the first minimum write size transferred to the TWB 161 to the pSLC block.

(3) In response to completion of the write operation to the pSLC, the controller 4 transmits one or more completion responses to one or more write commands to the host 2 via the host interface 11. The data written to the pSLC block is already readable data. Therefore, the controller 4 can transmit a completion response.

(4) The controller 4 executes the foggy write operation on the QLC block by transferring the data having the first minimum write size transferred to the TWB 161 to the QLC block.

(5) When the foggy write operation is completed, the controller 4 copies data having the first minimum write size from the TWB 161 to the LWB 66. Thereafter, the controller 4 releases the memory region of the TWB 161 in response to completion of copying of the data to the LWB 66.

The controller 4 repeats the operations (1) to (5).

(6) Then, in response to the fine write operation becoming executable, the controller 4 executes the fine write operation on the QLC block using the data stored in the LWB 66.

Next, details of the foggy-fine write operation on the QLC block to which the LWB 66 is not allocated will be described. FIG. 19 is a diagram illustrating a write operation executed using the TWB in the memory system according to the embodiment.

(1) The controller 4 receives one or more write commands specifying a certain QLC block from the host 2 via the host interface 11. In response to the total size of data associated with one or more write commands specifying a certain QLC block reaching the minimum write size (first minimum write size) of the QLC block, the controller 4 transfers data having the first minimum write size from the host write buffer 1021 to the TWB 161 via the host interface 11.

(2) The controller 4 performs the write operation on the pSLC block by transferring the data having the first minimum write size transferred to the TWB 161 to the pSLC block.

(3) In response to completion of the write operation to the pSLC, the controller 4 transmits one or more completion responses to one or more write commands to the host 2 via the host interface 11. The data written to the pSLC block is already readable data. Therefore, the controller 4 can transmit a completion response.

(4) The controller 4 executes the foggy write operation on the QLC block by transferring the data having the first minimum write size transferred to the TWB 161 to the QLC block. Thereafter, the controller 4 releases the memory region of the TWB 161 in response to completion of the foggy write to the QLC block.

The controller 4 repeats the operations (1) to (4).

(5) The controller 4 reads data from the pSLC block in response to the fine writing becoming executable. Then, the controller 4 executes the fine write operation on the QLC block using the read data. Thereafter, the controller 4 sets the data for which fine writing has been completed among the data written to the pSLC block as writing completion data.

Figure 20:
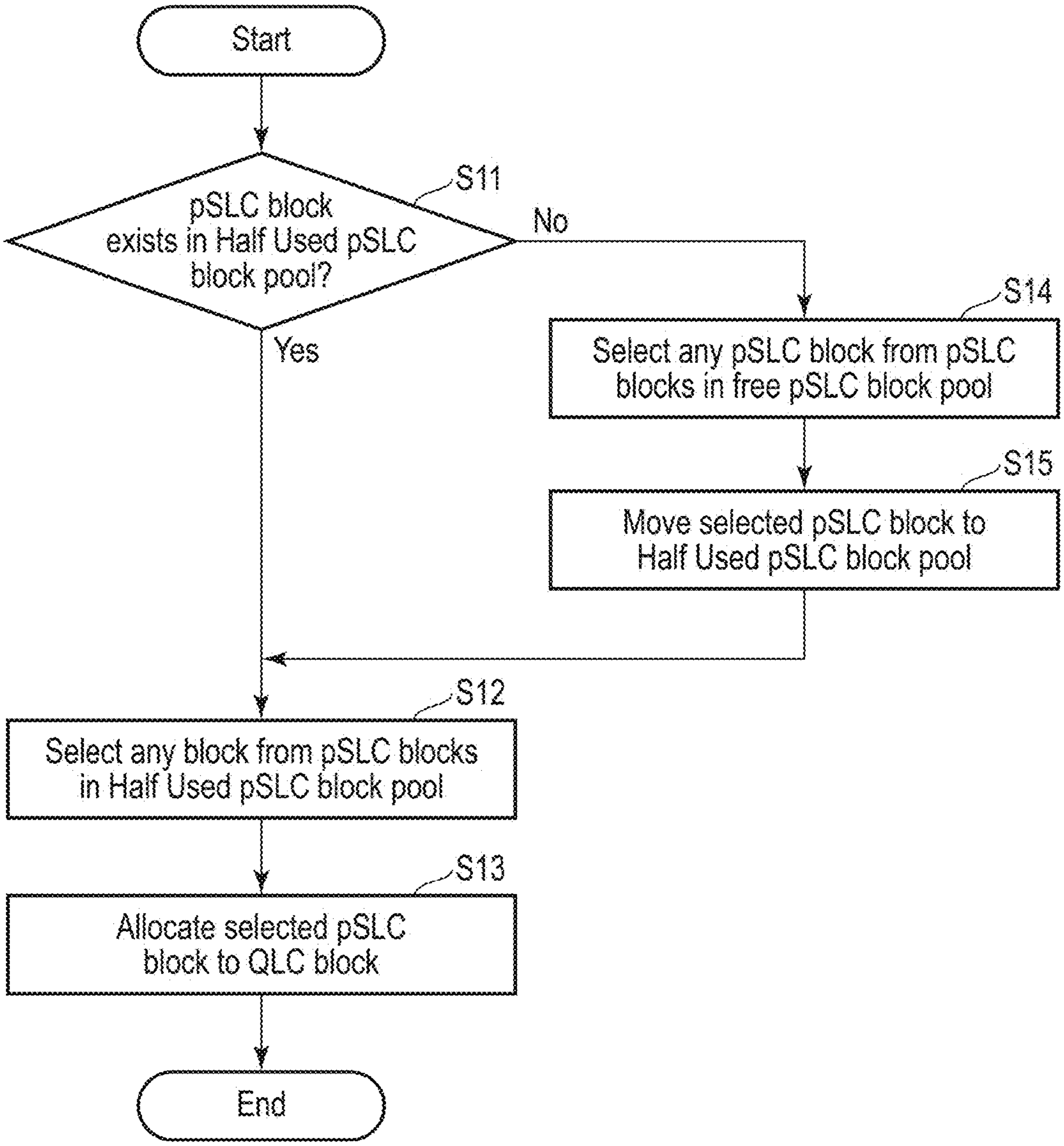
FIG. 20 is a flowchart illustrating a procedure of an operation of allocating a pSLC block to a QLC block, which is executed in the memory system according to the embodiment.

Next, the procedure of the operation of allocating the pSLC block to the QLC block will be described. FIG. 20 is a flowchart illustrating a procedure of the operation of allocating a pSLC block to a QLC block, which is executed in the memory system according to the embodiment.

When any QLC block is opened or when there is no unwritten region of the pSLC block allocated to any QLC block, the controller 4 starts the operation of allocating the pSLC block to the QLC block.

First, the controller 4 determines whether the pSLC block exists in the Half Used pSLC block pool 63 (step S11).

When the pSLC block exists in the Half Used pSLC block pool 63 (Yes in step S11), the controller 4 selects any pSLC block from the pSLC blocks existing in the Half Used pSLC block pool 63 (step S12). In consideration of wear leveling, the controller 4 may select the pSLC block in the Half Used pSLC block pool 63 so that the consumption degrees of all the pSLC blocks are almost equal.

The controller 4 allocates the pSLC block selected in step S12 to the QLC block (step S13).

When there is no pSLC block in the Half Used pSLC block pool 63 (No in step S11), the controller 4 selects any pSLC block from the pSLC blocks existing in the free pSLC block pool 62 (step S14). The controller 4 may select the pSLC block in the free pSLC block pool 62 in consideration of wear leveling.

The controller 4 moves the pSLC block selected in step S14 to the Half Used pSLC block pool 63 (step S15). The controller 4 executes the erase operation on the pSLC block selected in step S14. Then, the controller 4 adds the pSLC block to the list of the Half Used pSLC block pool 63, thereby executing the operation of step S15.

Then, the controller 4 selects any pSLC block from the pSLC blocks existing in the Half Used pSLC block pool 63 (step S12). That is, the controller 4 selects the pSLC block moved to the Half Used pSLC block pool 63 in step S15.

The controller 4 allocates the pSLC block selected in step S12 (step S14) to the QLC block (step S13). As a result, when allocating the pSLC block to the QLC block, the controller 4 preferentially allocates the pSLC block existing in the Half Used pSLC block pool 63 to the QLC block. In addition, in a case where there is no pSLC block in the Half Used pSLC block pool 63, the controller 4 selects a pSLC block from the free pSLC block pool 62, and allocates the pSLC block to the QLC block through the Half Used pSLC block pool 63. In addition, the controller 4 may directly allocate the pSLC block existing in the free pSLC block pool 62 to the QLC block without through the Half Used pSLC block pool 63.

Figure 21:
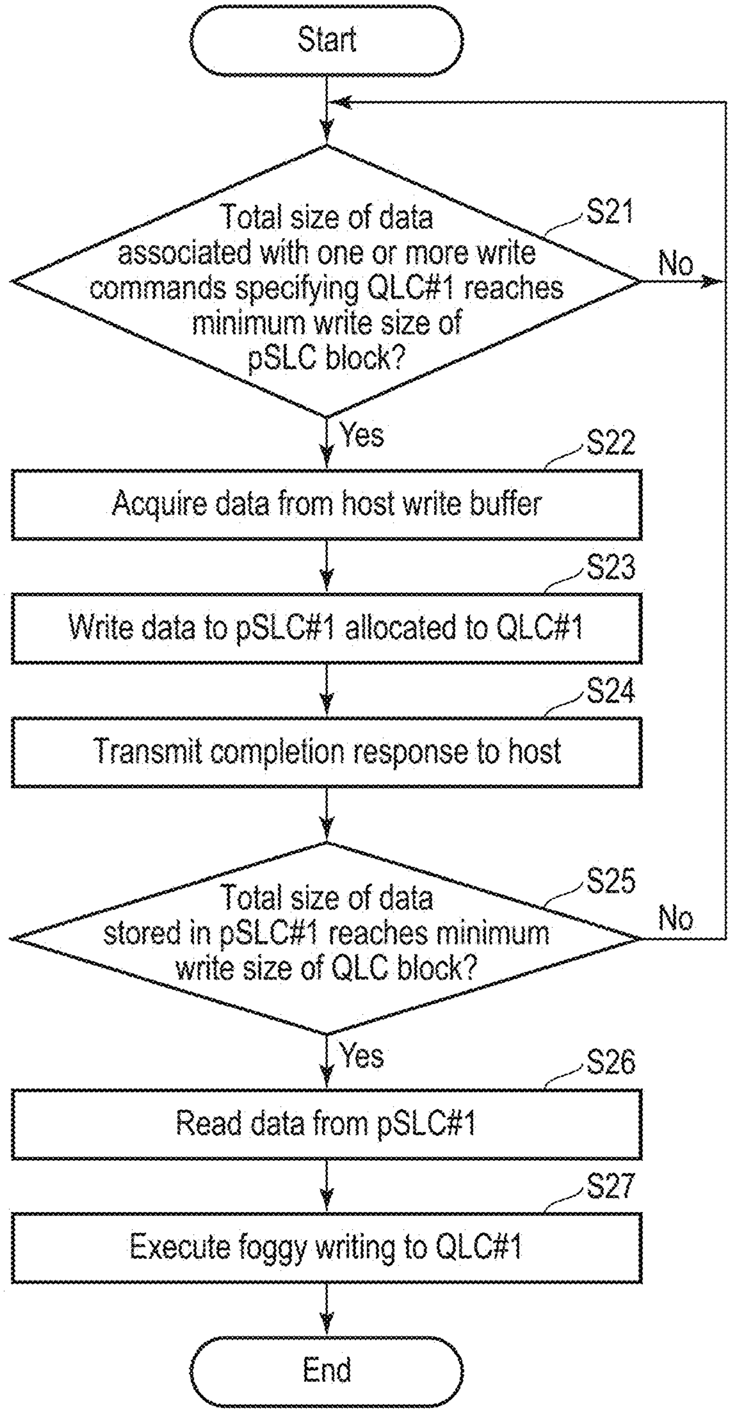
FIG. 21 is a flowchart illustrating a procedure of a foggy write operation on a certain QLC block executed in the memory system according to the embodiment.

Next, a procedure of the foggy write operation will be described. First, the foggy write operation in a case where the TWB 161 is not used will be described. FIG. 21 is a flowchart illustrating a procedure of the foggy write operation on a certain QLC block (QLC #1) executed in the memory system according to the embodiment.

First, when one or more write commands specifying QLC #1 are received, the controller 4 determines whether a total size of data associated with the one or more received write commands specifying QLC #1 reaches a minimum write size of the pSLC block (step S21). When the total size of the data associated with one or more received write commands specifying QLC #1 has not reached the minimum write size of the pSLC block (No in step S21), the controller 4 waits until the total size of the data associated with one or more received write commands specifying QLC #1 reaches the minimum write size of the pSLC block. When the total size of data associated with one or more write commands specifying QLC #1 reaches the minimum write size of the pSLC block (Yes in step S21), the controller 4 acquires data from the host write buffer 1021 (step S22).

The controller 4 writes the data acquired in step S23 to the pSLC block (pSLC #1) allocated to QLC #1 (step S23).

Then, the controller 4 transmits a completion response to each of the one or more write commands to the host 2 (step S24). That is, the controller 4 transmits a completion response to the write command associated with the data written in step S23 to the host 2.

The controller 4 determines whether the total size of the data stored in pSLC #1 has reached the minimum write size of the QLC block (step S25).

When the total size of the data stored in pSLC #1 does not reach the minimum write size of the QLC block (No in step S25), the controller 4 returns to the process of step S21. That is, the controller 4 repeats the write operation on pSLC #1 until the total size of the data stored in pSLC #1 reaches the minimum write size of the QLC block.

When the total size of the data stored in pSLC #1 reaches the minimum write size of the QLC block (Yes in step S25), the controller 4 reads data having the minimum write size of the QLC block from pSLC #1 (step S26).

The controller 4 executes foggy writing to QLC #1 using the data read in step S26 (step S27).

Figure 22:
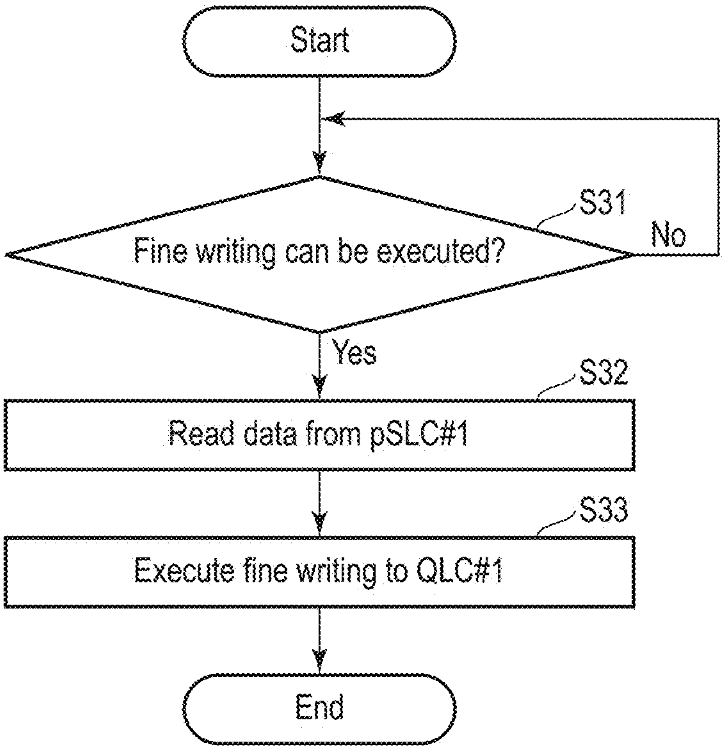
FIG. 22 is a flowchart illustrating an example of a procedure of the fine write operation a fine write operation on a certain QLC block executed in the memory system according to the embodiment.

Next, a procedure of the fine write operation will be described. First, a fine write operation in a case where the LWB 66 is not used will be described. FIG. 22 is a flowchart illustrating another example of the procedure of the fine write operation on QLC #1 executed in the memory system according to the embodiment.

First, the controller 4 determines whether the fine write operation on a certain word line of QLC #1 can be executed (step S31).

When the fine write operation on a certain word line of QLC #1 is not executable (No in step S31), the controller 4 waits until the fine write operation on a certain word line of QLC #1 is executable.

When the fine write operation on a certain word line of QLC #1 is executable (Yes in step S31), the controller 4 reads the data used in the foggy write operation on this word line from pSLC #1 (step S32).

The controller 4 executes the fine write operation on this word line of QLC #1 using the data read in step S32 (step S33). By executing the fine write operation, the data written to this word line of QLC #1 is readable data.

Figure 23:
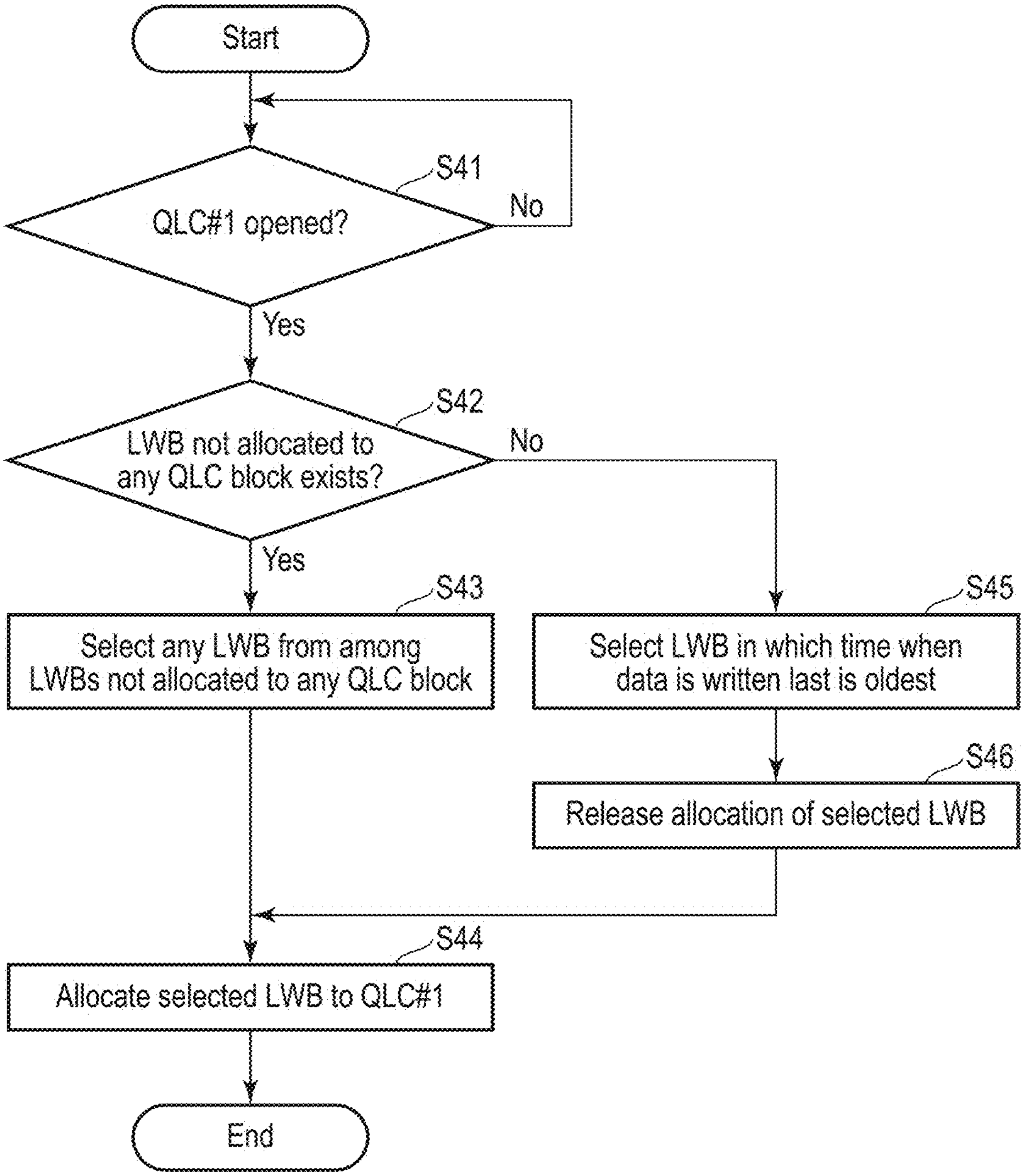
FIG. 23 is a flowchart illustrating a procedure of an operation of allocating the LWB to the QLC block executed in the memory system according to the embodiment.

Next, a procedure of an operation of allocating the LWB 66 to QLC #1 will be described. FIG. 23 is a flowchart illustrating a procedure of the operation of allocating the LWB to the QLC block executed in the memory system according to the embodiment. Allocation of the LWB to the QLC block is executed between the execution of the data erase operation for the QLC block and the first writing to the QLC block.

First, the controller 4 determines whether any QLC block (here, QLC #1) is opened as a write destination block (step S41). When QLC #1 is opened, as described in above, the controller 4 executes the operation of erase data of QLC #1 to make QLC #1 available for data writing.

When QLC #1 is not opened (No in step S41), the controller 4 repeatedly executes the determination process of step S41 until QLC #1 is opened.

When QLC #1 is opened (Yes in step S41), the controller 4 determines whether there is an LWB 66 not allocated to any QLC block (step S42).

When there is an LWB 66 not allocated to any QLC block (YES in step S42), the controller 4 selects any LWB 66 from among the LWBs 66 not allocated to any QLC block (step S43).

The controller 4 allocates the LWB 66 selected in step S43 to QLC #1 (step S44).

When there is no LWB 66 not allocated to any QLC block (No in step S42), the controller 4 deallocates the LWB 66 from any one of the plurality of already opened QLC blocks. The QLC block from which the LWB 66 is deallocated is, for example, a QLC block in which the time when the data is last written is the oldest. In this case, the controller 4 selects the QLC block in which the time when the data is last written is the oldest among the plurality of opened QLC blocks, and deallocates the LWB 66 from the selected QLC block. Note that, among the plurality of LWBs 66, the LWB 66 in which the time when the data is last written is the oldest may be selected as an LWB 66 allocated to the QLC block in which the time when the data is last written is the oldest. The LWB 66 in which the time when the latest data is written is the oldest is an LWB allocated to the QLC block to which the data is not written recently. Therefore, for example, the controller 4 may select the LWB 66 (LWB #1 in this case) in which the time when the latest data is written is the oldest is written from among the plurality of LWBs 66 (step S45). In step S45, the controller 4 may select the LWB 66 based on another algorithm.

The controller 4 releases allocation of the LWB #1 selected in step S45 (step S46). The controller 4 deallocates the LWB #1 from the QLC block to which LWB #1 has been allocated. As a result, the LWB #1 becomes an LWB 66 that is not allocated to any QLC block.

Then, the controller 4 allocates the LWB #1 selected in step S45 to QLC #1 (step S44).

Figure 24:
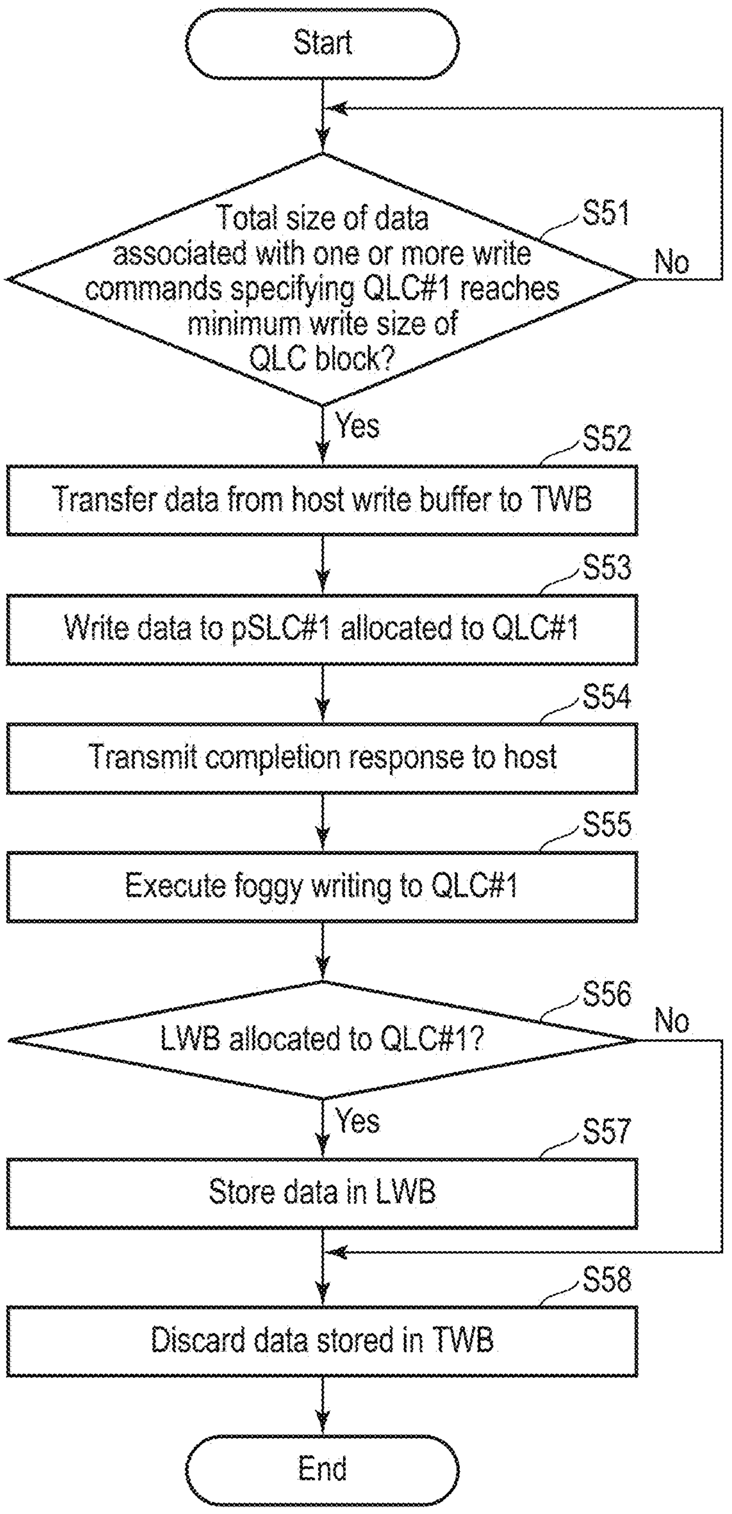
FIG. 24 is a flowchart illustrating a procedure of a foggy write operation on a certain QLC block performed using the TWB in the memory system according to the embodiment.

Next, a procedure of the foggy write executed using the TWB 161 will be described. FIG. 24 is a flowchart illustrating a procedure of the foggy write operation on a certain QLC block executed using the TWB in the memory system according to the embodiment.

First, the controller 4 determines whether a total size of data associated with one or more write commands specifying QLC #1 reaches a minimum write size of the QLC block (step S51).

When the total size of the data associated with one or more write commands specifying QLC #1 has not reached the minimum write size of the QLC block (No in step S51), the controller 4 waits until the total size of the data associated with one or more write commands specifying QLC #1 reaches the minimum write size of the QLC block.

When the total size of the data associated with one or more write commands specifying QLC #1 reaches the minimum write size of the QLC block (Yes in step S51), the controller 4 transfers the data having the minimum write size of the QLC block from the host write buffer 1021 to the TWB 161 (step S52).

The controller 4 writes the data transferred to the TWB 161 to pSLC #1 allocated to QLC #1 (step S53). Then, the controller 4 transmits one or more completion responses to each of the one or more write commands to the host 2 (step S54).

Thereafter, the controller 4 executes foggy writing to QLC #1 (step S55). The controller 4 executes foggy writing to QLC #1 using the data transferred to the TWB 161. Therefore, the controller 4 does not read data from pSLC #1 when executing foggy writing.

The controller 4 determines whether the large write buffer (LWB) 66 is allocated to QLC #1 (step S56).

When the LWB 66 is allocated to QLC #1 (Yes in step S56), the controller 4 copies the data stored in the TWB 161 to the LWB 66 allocated to QLC #1 (step S57).

The controller 4 discards the data stored in the TWB 161 (step S58). As a result, the TWB 161 can store new data.

When the LWB 66 is not allocated to QLC #1 (No in step S56), the controller 4 skips the operation on step S57 and discards the data stored in the TWB 161 (step S58).

Figure 25:
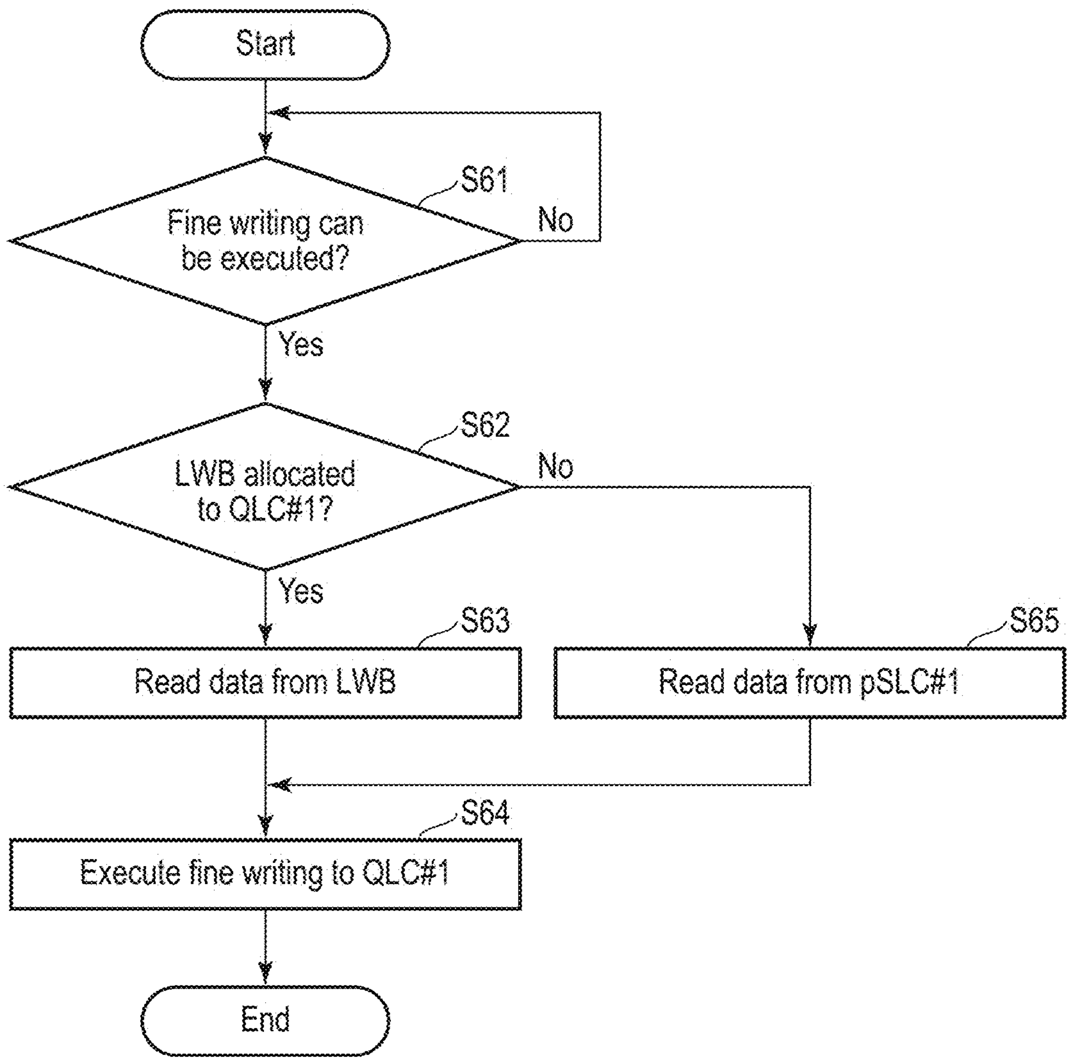
FIG. 25 is a flowchart illustrating a procedure of a fine write operation on a certain QLC block executed using the TWB in the memory system according to the embodiment.

Next, a procedure of the fine write operation executed using the TWB 161 will be described. FIG. 25 is a flowchart illustrating a procedure of the fine write operation on a certain QLC block executed using the TWB in the memory system according to the embodiment.

First, the controller 4 determines whether the fine write operation on a certain word line of QLC #1 can be executed (step S61).

When the fine write operation on a certain word line of QLC #1 is not executable (No in step S61), the controller 4 waits until the fine write operation on a certain word line of QLC #1 is executable.

When the fine write operation on a certain word line of QLC #1 is executable (Yes in step S61), the controller 4 determines whether the LWB 66 is allocated to QLC #1 (step S62).

When the LWB 66 is allocated to QLC #1 (Yes in step S62), the controller 4 reads the data used in the foggy write operation on this word line from the LWB 66 (step S63).

Then, the controller 4 executes fine writing to the word line of QLC #1 using the data read in step S63 (step S64).

When the LWB 66 is not allocated to QLC #1 (No in step S62), the controller 4 reads the data used in the foggy write operation on this word line from pSLC #1 (step S65).

Then, the controller 4 executes fine writing to QLC #1 using the data read in step S65 (step S64). As described above, according to the present embodiment, the controller 4 allocates the pSLC block (for example, pSLC #1) included in the pSLC buffer 201 to the QLC block (for example, QLC #1) included in the QLC region 202. The controller 4 writes only data to be written to QLC #1 to pSLC #1. Then, while pSLC #1 is allocated to QLC #1, the controller 4 does not write data to be written to the QLC block other than QLC #1 to pSLC #1.

In addition, when QLC #1 is filled with data that has been written to QLC #1 in a state where an unwritten region remains in pSLC #1, the controller 4 deallocates pSLC #1 from QLC #1. Then, the controller 4 returns the deallocated pSLC #1 to the Half Used pSLC block pool 63 so that pSLC #1 can be reused. Thereafter, when pSLC #1 is allocated to QLC #2, the controller 4 writes only data to be written to QLC #2 to the unwritten region of pSLC #1.

As a result, a situation in which write-incompleted data to be written to a plurality of QLC blocks is mixed in pSLC #1 cannot occur. The controller 4 can efficiently operate the pSLC block without executing the garbage collection process on the pSLC buffer 201 including pSLC #1.

When executing the first-step write operation (foggy write operation) on QLC #1, the controller 4 may use the data stored in the TWB 161 without reading the data from pSLC #1. Further, when executing the second-step write operation (fine write operation) on QLC #1, the controller 4 may use the data stored in the LWB 66 without reading the data from pSLC #1.

As a result, the controller 4 can execute the foggy-fine write operation on QLC #1 without reading data from pSLC #1. Therefore, the controller 4 can suppress consumption of a bandwidth for data transfer between the controller 4 and the NAND flash memory 5. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, the memory system comprising:

a nonvolatile memory including a plurality of blocks, each of the plurality of blocks being a unit for a data erase operation; and a controller electrically connected to the nonvolatile memory and configured to:

manage a plurality of block groups, each of the plurality of block groups including one or more first blocks among the plurality of blocks, data to be written to each of the one or more first blocks in units of a first minimum write size;

manage at least one second block among the plurality of blocks, data to be written to the second block in units of a second minimum write size smaller than the first minimum write size;

determine that a total size of first data associated with one or more first write commands reaches the second minimum write size, each of the one or more first write commands being received from the host and specifying an identifier corresponding to a first block group among the plurality of block groups;

in response to determining that the total size of first data reaches the second minimum write size, write, to the second block, second data which is at least part of the first data and has a size of the second minimum write size;

determine that a total size of one or more pieces of the second data written to the second block reaches the first minimum write size;

in response to determining that the total size of the one or more pieces of the second data reaches the first minimum write size, read, from the second block, third data which includes the one or more pieces of the second data and has a size of the first minimum write size; and write the third data to one of the one or more first blocks included in the first block group.

2. The memory system according to claim 1, wherein the controller is further configured to:

manage a namespace that is divided into a plurality of zones; and assign the first block group to a first zone among the plurality of zones, and each of the one or more first write commands specifies an identifier of the first zone as the identifier corresponding to the first block group.

3. The memory system according to claim 1, wherein each of the plurality of block groups includes only one first block.

4. The memory system according to claim 1, wherein the controller is further configured to:

in response to receiving, from the host, a first read command that specifies the identifier corresponding to the first block group and requests to read at least part of the first data after the part of the first data is written to the second block and before the part of the first data is written to the one of the one or more first blocks included in the first block group, read the part of the first data from the second block.

5. The memory system according to claim 1, wherein the controller is further configured to:

upon the first block group being assigned as a write destination, allocate the second block from the plurality of blocks dedicatedly to the first block group;

upon a second block group among the plurality of block groups being assigned as a write destination, allocate at least one third block from the plurality of blocks dedicatedly to the second block group, data to be written to the third block in units of the second minimum write size; and upon a total size of fourth data associated with one or more second write commands reaching the second minimum write size, each of the one or more second write commands being received from the host and specifying an identifier corresponding to the second block group, write, to the third block, fifth data which is at least part of the fourth data and has a size of the second minimum write size.

6. The memory system according to claim 1, wherein each of the plurality of blocks includes a plurality of memory cells, and the controller is configured to:

write N-bits data to each of the plurality of memory cells included in the one of the one or more first blocks included in the first block group; and write M-bits data to each of the plurality of memory cells included in the second block, M being smaller than N.

7. The memory system according to claim 1, wherein the controller is further configured to:

in response to completion of the writing of the second data to the second block, transmit, to the host, at least one completion response indicating completion of at least one of the one or more first write commands.

8. The memory system according to claim 1, wherein the controller is configured to:

write the third data, which has been read from the second block, to the one of the one or more first blocks included in the first block group by a first-step write operation, the first-step write operation being one step of a multi-step write operation that includes at least the first-step write operation and a second-step write operation, the first-step write operation including writing the third data to the one of the one or more first blocks included in the first block group, the second-step write operation including writing the third data again to the one of the one or more first blocks included in the first block group.

9. The memory system according to claim 8, wherein the controller is further configured to:

in executing the second-step write operation for the third data, read the third data again from the second block, and write the third data, which has been read again from the second block, again to the one of the one or more first blocks included in the first block group by the second-step write operation.

10. The memory system according to claim 8, further comprising a buffer, wherein the controller is further configured to:

store the third data, which has been read from the second block, in the buffer; and in executing the second-step write operation for the third data, read the third data from the buffer without reading the third data again from the second block, and write the third data, which has been read from the buffer, again to the one of the one or more first blocks included in the first block group by the second-step write operation.

11. A method of controlling a nonvolatile memory, the nonvolatile memory including a plurality of blocks, each of the plurality of blocks being a unit for a data erase operation, the method comprising:

managing a plurality of block groups, each of the plurality of block groups including one or more first blocks among the plurality of blocks, data being to be written to each of the one or more first blocks in units of a first minimum write size;

managing at least one second block among the plurality of blocks, data to be written to the second block in units of a second minimum write size smaller than the first minimum write size;

determining that a total size of first data associated with one or more first write commands reaches the second minimum write size, each of the one or more first write commands being received from a host and specifying an identifier corresponding to a first block group among the plurality of block groups;

in response to determining that the total size of first data reaches the second minimum write size, writing, to the second block, second data which is at least part of the first data and has a size of the second minimum write size;

determining that a total size of one or more pieces of the second data written to the second block reaches the first minimum write size;

in response to determining that the total size of the one or more pieces of the second data reaches the first minimum write size, reading, from the second block, third data which includes the one or more pieces of the second data and has a size of the first minimum write size; and writing the third data to one of the one or more first blocks included in the first block group.

12. The method according to claim 11, further comprising:

managing a namespace that is divided into a plurality of zones; and assigning the first block group to a first zone among the plurality of zones, wherein each of the one or more first write commands specifies an identifier of the first zone as the identifier corresponding to the first block group.

13. The method according to claim 11, wherein each of the plurality of block groups includes only one first block.

14. The method according to claim 11, further comprising:

receiving, from the host, a first read command that specifies the identifier corresponding to the first block group and requests to read at least part of the first data after the part of the first data is written to the second block and before the part of the first data is written to the one of the one or more first blocks included in the first block group; and in response to the first read command, reading the part of the first data from the second block.

15. The method according to claim 11, further comprising:

assigning the first block group as a write destination;

upon the first block group being assigned as the write destination, allocating the second block from the plurality of blocks dedicatedly to the first block group;

assigning a second block group among the plurality of block groups a write destination;

upon the second block group being assigned as the write destination, allocating at least one third block from the plurality of blocks dedicatedly to the second block group, data to be written to the third block in units of the second minimum write size;

determining that a total size of fourth data associated with one or more second write commands reaches the second minimum write size, each of the one or more second write commands being received from the host and specifying an identifier corresponding to the second block group; and in response to determining that the total size of fourth data reaches the second minimum write size, writing, to the third block, fifth data which is at least part of the fourth data and has a size of the second minimum write size.

16. The method according to claim 11, wherein each of the plurality of blocks includes a plurality of memory cells, N-bits data is written to each of the plurality of memory cells included in the one of the one or more first blocks included in the first block group, and M-bits data is written to each of the plurality of memory cells included in the second block, M being smaller than N.

17. The method according to claim 11, further comprising:

in response to completion of the writing of the second data to the second block, transmitting, to the host, at least one completion response indicating completion of at least one of the one or more first write commands.

18. The method according to claim 11, wherein the third data, which has been read from the second block, is written to the one of the one or more first blocks included in the first block group by a first-step write operation, the first-step write operation being one step of a multi-step write operation that includes at least the first-step write operation and a second-step write operation, the first-step write operation including writing the third data to the one of the one or more first blocks included in the first block group, the second-step write operation including writing the third data again to the one of the one or more first blocks included in the first block group.

19. The method according to claim 18, further comprising:

in executing the second-step write operation for the third data, reading the third data again from the second block, and writing the third data, which has been read again from the second block, again to the one of the one or more first blocks included in the first block group by the second-step write operation.

20. The method according to claim 18, further comprising:

storing the third data, which has been read from the second block, in a buffer; and in executing the second-step write operation for the third data, reading the third data from the buffer without reading the third data again from the second block, and writing the third data, which has been read from the buffer, again to the one of the one or more first blocks included in the first block group by the second-step write operation.

* * * * *